US012813091B2

(12) United States Patent
Shin et al.

(10) Patent No.: US 12,813,091 B2
(45) Date of Patent: Nov. 24, 2026

(54) DISPLAY APPARATUS HAVING ENCAPSULATION LAYERS WITH ISOLATED SHAPES AND METHOD OF MANUFACTURING THE SAME

(71) Applicant: Samsung Display Co., Ltd., Yongin-si (KR)

(72) Inventors: Hyuneok Shin, Yongin-si (KR); Yunjong Yeo, Yongin-si (KR); Byungsoo So, Yongin-si (KR); Seungyong Song, Yongin-si (KR); Keunho Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 346 days.

(21) Appl. No.: 18/584,942

(22) Filed: Feb. 22, 2024

(65) Prior Publication Data

US 2025/0031524 A1 Jan. 23, 2025

(30) Foreign Application Priority Data

Jul. 20, 2023 (KR) ........................ 10-2023-0094655

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/873* (2023.02)

(58) Field of Classification Search
CPC . H10K 59/122; H10K 59/1201; H10K 59/873
See application file for complete search history.

(56) References Cited

U.S. PATENT DOCUMENTS 11,251,398 B2 2/2022 Wang
12,588,358 B2 * 3/2026 Yamazaki .......... H10K 59/1201
(Continued)

FOREIGN PATENT DOCUMENTS

CN 110741489 A 1/2020
CN 112952022 A 6/2021
(Continued)

*Primary Examiner* — Michael Jung
(74) *Attorney, Agent, or Firm* — Womble Bond Dickinson (US) LLP

(57) ABSTRACT

A display apparatus includes: a first and second sub-pixel electrodes spaced apart from each other; a subpixel-defining layer covering edges of the first and second sub-pixel electrodes; a first stack including a first emission layer and a first opposite electrode, on the subpixel-defining layer, and overlapping the first sub-pixel electrode; a second stack including a second emission layer and a second opposite electrode, on the subpixel-defining layer, and overlapping the second sub-pixel electrode; a first encapsulation layer covering each of edges of the first stack and edges of the second stack, and including first openings overlapping each of the first stack and the second stack, and a second opening between the first stack and the second stack; and a common electrode on the first encapsulation layer and electrically connected to the first opposite electrode of the first stack and the second opposite electrode of the second stack.

19 Claims, 22 Drawing Sheets

(56) References Cited

U.S. PATENT DOCUMENTS

| | | | | |
|---|---|---|---|---|
| 2015/0060783 | A1* | 3/2015 | Yoon | H10K 59/131 257/40 |
| 2017/0365812 | A1* | 12/2017 | Choung | H10K 59/122 |
| 2018/0315806 | A1* | 11/2018 | Lee | H10K 59/35 |
| 2018/0366524 | A1* | 12/2018 | Bang | H10K 59/80521 |
| 2021/0104589 | A1* | 4/2021 | Shin | H10H 29/142 |
| 2021/0191552 | A1* | 6/2021 | Bok | G09G 3/32 |
| 2022/0013746 | A1* | 1/2022 | Joo | H10K 59/131 |
| 2022/0223671 | A1 | 7/2022 | Yamazaki et al. | |
| 2023/0011322 | A1 | 1/2023 | Park | |
| 2023/0389392 | A1* | 11/2023 | Zhang | H10K 50/17 |

FOREIGN PATENT DOCUMENTS

| | | | |
|---|---|---|---|
| JP | 2022-109242 | A | 7/2022 |
| KR | 10-2022-0103040 | A | 7/2022 |
| KR | 10-2023-0010866 | A | 1/2023 |

* cited by examiner

DISPLAY APPARATUS HAVING ENCAPSULATION LAYERS WITH ISOLATED SHAPES AND METHOD OF MANUFACTURING THE SAME

CROSS-REFERENCE TO RELATED APPLICATION

The present application claims priority to and the benefit of Korean Patent Application No. 10-2023-0094655, filed on Jul. 20, 2023, in the Korean Intellectual Property Office, the entire disclosure of which is incorporated herein by reference.

BACKGROUND

1. Field

Aspects of one or more embodiments relate to a display apparatus including a light-emitting diode and a method of manufacturing the display apparatus.

2. Description of the Related Art

Display apparatuses visually display data. Display apparatuses may display images using light-emitting diodes. The purpose and structure of display apparatuses have diversified over time and a structure that may be bent to a preset angle with respect to a flat state may be desired.

A display apparatus may include a plurality of sub-pixels of a pattern form to display images. To implement the plurality of sub-pixels, a plurality of light-emitting diodes each including a sub-pixel electrode, an emission layer, and an opposite electrode may be arranged over a substrate. The plurality of light-emitting diodes may be arranged or formed simultaneously (or concurrently) or sequentially individually.

The above information disclosed in this Background section is only for enhancement of understanding of the background and therefore the information discussed in this Background section does not necessarily constitute prior art.

SUMMARY

While a light-emitting diode of a pattern form is formed over a substrate, a portion of each of layers forming the light-emitting diode may be exposed. When each layer is exposed, there is a risk of moisture or contaminant penetration and/or oxidation into each layer (especially oxidation of the layer containing metal). This may lead to deterioration of image quality and reliability of the display apparatus. Aspects of one or more embodiments include a display apparatus in which exposure of each layer may be reduced while a light-emitting diode is formed, and a method of manufacturing the display apparatus.

Additional aspects will be set forth in part in the description which follows and, in part, will be apparent from the description, or may be learned by practice of the presented embodiments of the disclosure.

According to one or more embodiments, a display apparatus includes a first sub-pixel electrode and a second sub-pixel electrode apart from each other, a subpixel-defining layer covering edges of the first sub-pixel electrode and edges of the second sub-pixel electrode, a first stack including a first emission layer and a first opposite electrode, on the subpixel-defining layer, and overlapping the first sub-pixel electrode, a second stack including a second emission layer and a second opposite electrode, on the subpixel-defining layer, and overlapping the second sub-pixel electrode, a first encapsulation layer covering each of edges of the first stack and edges of the second stack, and including first openings overlapping each of the first stack and the second stack, and a second opening between the first stack and the second stack, and a common electrode on the first encapsulation layer and electrically connected to the first opposite electrode of the first stack and the second opposite electrode of the second stack.

According to some embodiments, the first encapsulation layer may overlap a lateral surface and a portion of an upper surface of the first stack and a lateral surface and a portion of an upper surface of the second stack.

According to some embodiments, the display apparatus may further include first auxiliary layers respectively between the first opposite electrode and the common electrode and between the second opposite electrode and the common electrode.

According to some embodiments, the display apparatus may further include a second auxiliary layer between the second sub-pixel electrode and the second emission layer, wherein a central portion of the second auxiliary layer may be in direct contact with the second sub-pixel electrode, and an outer portion of the second auxiliary layer may be apart from the second sub-pixel electrode by the subpixel-defining layer.

According to some embodiments, a number of layers between the first sub-pixel electrode and the first opposite electrode may be different from a number of layers between the second sub-pixel electrode and the second opposite electrode.

According to some embodiments, the display apparatus may further include a second encapsulation layer on the common electrode and extending to overlap the first stack and the second stack.

According to some embodiments, in a plan view, the second opening of the first encapsulation layer may have a net structure surrounding each of the first openings.

According to one or more embodiments, a display apparatus includes first to third sub-pixel electrodes apart from each other, a subpixel-defining layer covering edges of each of the first to third sub-pixel electrodes and including openings overlapping a central portion of each of the first to third sub-pixel electrodes, first to third emission layers respectively on the first to third sub-pixel electrodes, first to third opposite electrodes respectively on the first to third emission layers, a 1-1 encapsulation layer covering the first emission layer and at least a portion of the first opposite electrode and including an opening overlapping a central portion of the first opposite electrode, a 1-2 encapsulation layer covering the second emission layer and at least a portion of the second opposite electrode and including an opening overlapping a central portion of the second opposite electrode, a 1-3 encapsulation layer covering the third emission layer and at least a portion of the third opposite electrode and including an opening overlapping the central portion of the first opposite electrode, and a common electrode on the first to third opposite electrodes and electrically connected to the first to third opposite electrodes, wherein the 1-1 to 1-3 encapsulation layers have an isolated shape and are apart from each other.

According to some embodiments, the common electrode may be in contact with an upper surface of the subpixel-defining layer in a space between adjacent encapsulation layers among the 1-1 to 1-3 encapsulation layers.

According to some embodiments, the display apparatus may further include a 1-1 auxiliary layer between the first opposite electrode and the common electrode, a 1-2 auxiliary layer between the second opposite electrode and the common electrode, and a 1-3 auxiliary layer between the third opposite electrode and the common electrode.

According to some embodiments, the 1-1 encapsulation layer may be in direct contact with a lateral surface and a portion of an upper surface of the 1-1 auxiliary layer, a lateral surface of the first opposite electrode, and a lateral surface of the first emission layer.

According to some embodiments, the display apparatus may further include a 2-2 auxiliary layer between the second sub-pixel electrode and the second emission layer, wherein the first sub-pixel electrode is in direct contact with the first emission layer.

According to some embodiments, the display apparatus may further include a second encapsulation layer on the common electrode.

According to some embodiments, in a plan view, each of the 1-1 to 1-3 encapsulation layers may surround edges of the 1-1 to 1-3 opposite electrodes.

According to one or more embodiments, a method of manufacturing a display apparatus includes forming a first sub-pixel electrode and a second sub-pixel electrode apart from each other, forming a first stack layer on the first sub-pixel electrode and the second sub-pixel electrode, wherein the first stack layer includes a light-emitting material layer and an opposite electrode layer, forming a 1-1 auxiliary material layer on the first stack layer, forming a first stack and a 1-1 auxiliary layer overlapping the first stack by etching the first stack layer and a portion of the 1-1 auxiliary material layer, wherein the first stack overlaps the first sub-pixel electrode and includes a first emission layer and a first opposite electrode, forming a 1-1 encapsulation material layer to cover the first stack and the 1-1 auxiliary layer, forming a 1-1 encapsulation layer by etching a portion of the 1-1 encapsulation material layer, wherein the 1-1 encapsulation layer overlaps an upper surface of the first stack and an upper surface of the 1-1 auxiliary layer entirely, forming a second stack layer on the 1-1 encapsulation layer and the second sub-pixel electrode, wherein the second stack layer includes a light-emitting material layer and an opposite electrode layer, forming a 1-2 auxiliary material layer on the second stack layer, forming a second stack and a 1-2 auxiliary layer overlapping the second stack by etching the second stack layer and a portion of the 1-2 auxiliary material layer, wherein the second stack overlaps the second sub-pixel electrode and includes a second emission layer and a second opposite electrode, forming a 1-2 encapsulation material layer to cover the second stack and the 1-2 auxiliary layer, and forming a 1-2 encapsulation layer by etching a portion of the 1-2 encapsulation material layer, wherein the 1-2 encapsulation layer overlaps an upper surface of the second stack and an upper surface of the 1-2 auxiliary layer entirely, wherein the 1-1 encapsulation layer and the 1-2 encapsulation layer are apart from each other.

According to some embodiments, the method may further include forming a first opening in each of the 1-1 encapsulation layer and the 1-2 encapsulation layer.

According to some embodiments, the 1-1 encapsulation layer may be in direct contact with a lateral surface and a portion of an upper surface of the 1-1 auxiliary layer, and a lateral surface of the first stack, and the 1-2 encapsulation layer may be in direct contact with a lateral surface and a portion of an upper surface of the 1-2 auxiliary layer, and a lateral surface of the second stack.

According to some embodiments, the method may further include forming a second auxiliary material layer under the second stack layer, wherein the forming of the second stack may include forming a second auxiliary layer by etching a portion of the second auxiliary material layer, the second auxiliary layer being in direct contact with an upper surface of the second sub-pixel electrode.

According to some embodiments, the method may further include forming a common electrode layer overlapping the first opening of the 1-1 encapsulation layer and the first opening of the 1-2 encapsulation layer.

According to some embodiments, the method may further include forming a subpixel-defining layer covering edges of the first sub-pixel electrode and edges of the second sub-pixel electrode, wherein the common electrode layer may be in direct contact with an upper surface of the subpixel-defining layer through a separation region between the 1-1 encapsulation layer and the 1-2 encapsulation layer.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
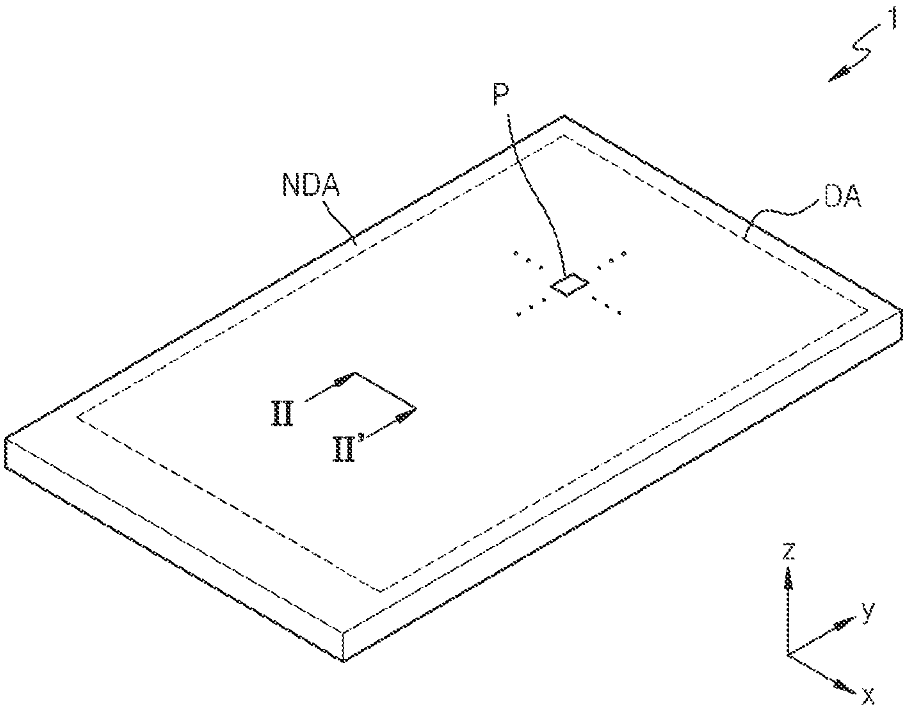
FIG. 1 is a schematic perspective view of a display apparatus according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, and/or any combination of a, b, and/or c.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where a certain embodiment may be implemented differently, a specific process order may be performed in the order different from the described order. As an example, two processes successively described may be simultaneously performed substantially and performed in the opposite order.

In the present specification, "A and/or B" means A or B, or A and B. In the present specification, "at least one of A and B" means A or B, or A and B, or any combination of A and/or B.

It will be understood that when a layer, region, or element is referred to as being "connected" to another layer, region, or element, it may be "directly connected" to the other layer, region, or element or may be "indirectly connected" to the other layer, region, or element with another layer, region, or element located therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element interposed therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different orientations that are not perpendicular to one another.

FIG. 1 is a schematic perspective view of a display apparatus 1 according to some embodiments.

Referring to FIG. 1, the display apparatus 1 may include a display area DA and a non-display area NDA outside the display area DA. The display area DA may be configured to display images through sub-pixels P arranged in the display area DA. The non-display area NDA is arranged outside the display area DA and does not display images. The non-display area NDA may surround the display area DA entirely. A driver and the like configured to provide electrical signals or power to the display area DA may be arranged in the non-display area NDA. A pad may be arranged in the non-display area NDA, wherein the pad is a region to which electronic elements or a printed circuit board may be electrically connected.

According to some embodiments, although FIG. 1 shows that the display area DA is a polygon (e.g., a quadrangle) in which a length thereof in an x direction is less than a length thereof in a y direction, the display area DA may be a polygon (e.g., a quadrangle) in which a length thereof in the y direction is less than a length thereof in the x direction according to some embodiments. Although FIG. 1 shows the display area DA is an approximately quadrangle, the embodiments according to the present disclosure are not limited thereto. According to some embodiments, the display area DA may have various shapes such as an N-gon (where N is a natural number of 3 or more), a circle, or an ellipse. Although it is shown in FIG. 1 that the display area DA has a shape in which a corner of the display area DA includes a vertex at which a straight line meets a straight line, the display area DA may have a polygon in which a corner portion is curved according to some embodiments.

Hereinafter, for convenience of description, although the case where the display apparatus 1 is a smartphone is described, the display apparatus 1 according to some embodiments are not limited thereto. The display apparatus 1 is applicable to various products including televisions, notebook computers, monitors, advertisement boards, Internet of things (IoTs) as well as portable electronic apparatuses including mobile phones, smartphones, tablet personal computers (PCs), mobile communication terminals, electronic organizers, electronic books, portable multimedia players (PMPs), navigations, and ultra mobile personal computers (UMPCs). In addition, the display apparatus 1 according to some embodiments is applicable to wearable devices including smartwatches, watchphones, glasses-type displays, and head-mounted displays (HMDs). In addition, according to some embodiments, the display apparatus 1 is applicable to a display screen in instrument panels for automobiles, center fascias for automobiles, or center information displays (CIDs) arranged on a dashboard, room mirror displays that replace side mirrors of automobiles, and displays of an entertainment system arranged on the backside of front seats for backseat passengers in automobiles.

Figure 2:
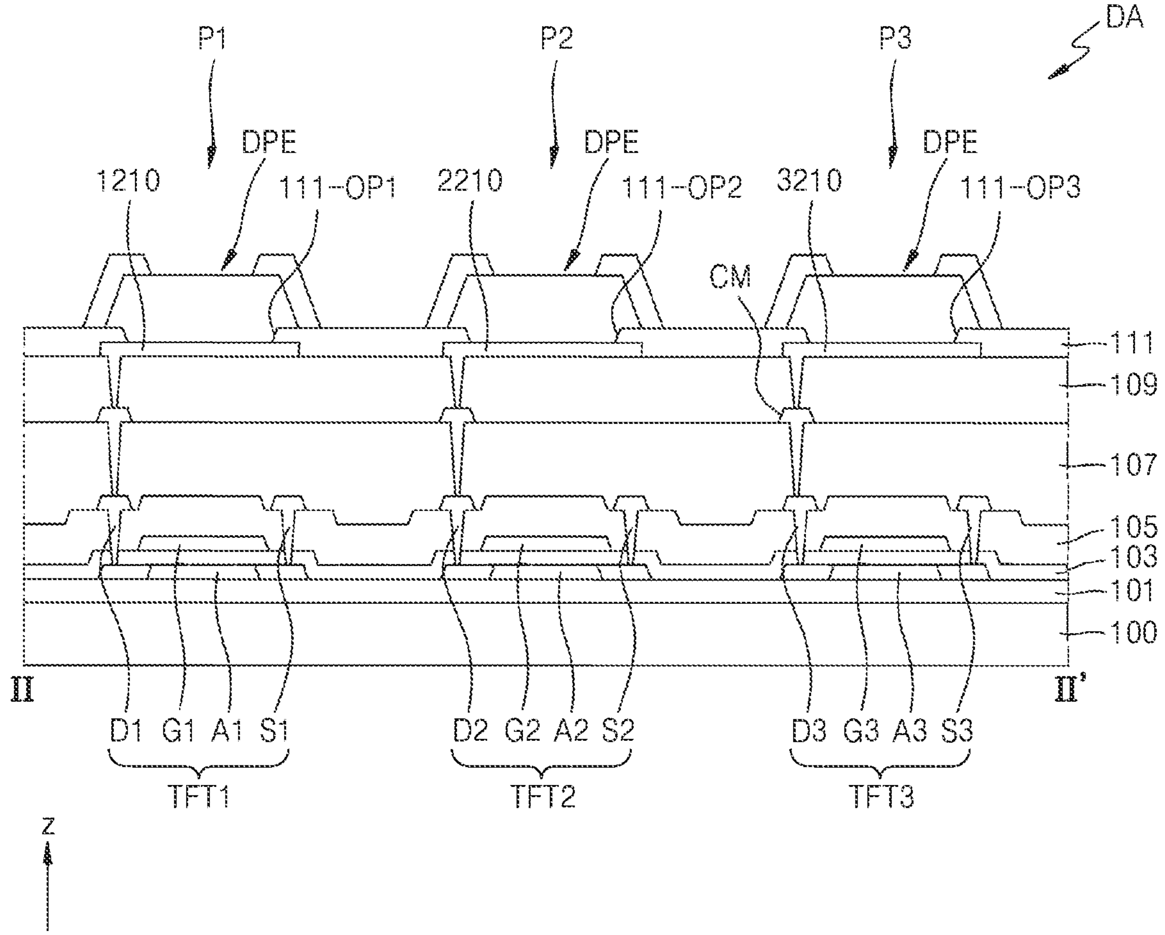
FIG. 2 is a schematic cross-sectional view of a portion of a display apparatus according to some embodiments.

FIG. 2 is a schematic cross-sectional view of a portion of a display apparatus according to some embodiments.

Referring to FIG. 2, a plurality of sub-pixels may be arranged in the display area DA over a substrate 100. As an example, first to third sub-pixels P1, P2, and P3 may be located over the substrate 100.

The substrate 100 may include glass or polymer resin of a plastic material. The substrate 100 may have a structure in which a base layer including polymer resin and an inorganic barrier layer including an inorganic insulating material are stacked. Polymer resins include polyethersulfone (PES), polyether imide (PEI), polyethylene naphthalate (PEN), polyethylene terephthalate (PET), polyphenylene sulfide (PPS), polyarylate (PAR), polyimide (PI), polycarbonate (PC), and the like. According to some embodiments, in the case where the substrate 100 includes a plastic material or a metal material, flexibility may be improved compared to the case where the substrate 100 includes a glass material.

Display elements DPE respectively corresponding to the first to third sub-pixels P1, P2, and P3 may be respectively electrically connected to first to third thin-film transistors TFT1, TFT2, and TFT3.

As an example, a first sub-pixel electrode 1210 of the display element DPE corresponding to the first sub-pixel P1 may be electrically connected to the first thin-film transistor TFT1. The first thin-film transistor TFT1 may include a first active layer A1, a first gate electrode G1, a first source electrode S1, and a first drain electrode D1, wherein the first gate electrode G1 overlaps a portion of the first active layer A1, and each of the first source electrode S1 and the first drain electrode D1 is in direct contact with a portion of the first active layer A1.

A second sub-pixel electrode 2210 of the display element DPE corresponding to the second sub-pixel P2 may be electrically connected to the second thin-film transistor TFT2. The second thin-film transistor TFT2 may include a second active layer A2, a second gate electrode G2, a second source electrode S2, and a second drain electrode D2, wherein the second gate electrode G2 overlaps a portion of the second active layer A2, and each of the second source electrode S2 and the second drain electrode D2 is in direct contact with a portion of the second active layer A2.

A third sub-pixel electrode 3210 of the display element DPE corresponding to the third sub-pixel P3 may be electrically connected to the third thin-film transistor TFT3. The third thin-film transistor TFT3 may include a third active layer A3, a third gate electrode G3, a third source electrode S3, and a third drain electrode D3, wherein the third gate electrode G3 overlaps a portion of the third active layer A3, and each of the third source electrode S3 and the third drain electrode D3 is in direct contact with a portion of the third active layer A3.

The first to third gate electrodes G1, G2, and G3 may include at least one among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and include a single layer or a multi-layer including the above materials.

A buffer layer 101 may be located between the first to third active layers A1, A2, and A3, and the substrate 100, wherein the buffer layer 101 is configured to prevent penetration of impurities. A gate insulating layer 103 may be located between the first to third active layers A1, A2, and A3, and the first to third gate electrodes G1, G2, and G3. An interlayer insulating layer 105 may be located on the first to third gate electrodes G1, G2, and G3. Each of the buffer layer 101, the gate insulating layer 103, and the interlayer insulating layer 105 may include an inorganic insulating material such as silicon oxide ($SiO_x$), silicon nitride ($SiN_x$), silicon oxynitride (SiON), aluminum oxide ($AlO_x$), and aluminum nitride ($AlN_x$), titanium oxide ($TiO_x$), or titanium nitride ($TiN_x$).

The first to third source electrodes S1, S2, and S3 may be located on the interlayer insulating layer 105 and respectively connected to the first to third active layers A1, A2, and A3 through contact holes formed in the interlayer insulating layer 105 and the gate insulating layer 103. The first to third source electrodes S1, S2, and S3 may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu), and include a single layer or a multi-layer including the above materials.

The first to third drain electrodes D1, D2, and D3 may be located on the interlayer insulating layer 105 and respectively connected to the first to third active layers A1, A2, and A3 through contact holes formed in the interlayer insulating layer 105 and the gate insulating layer 103. The first to third drain electrodes D1, D2, and D3 may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu), and include a single layer or a multi-layer including the above materials. According to some embodiments, the first to third source electrodes S1, S2, and S3 and the first to third drain electrodes D1, D2, and D3 may include the same material.

A first organic insulating layer 107 may be located on the first to third thin-film transistors TFT1, TFT2, and TFT3. As an example, the first organic insulating layer 107 may be arranged to cover the first to third source electrodes S1, S2, and S3 and the first to third drain electrodes D1, D2, and D3. The first organic insulating layer 107 may include an organic insulating material such as acryl, benzocyclobutene (BCB), polyimide (PI), or hexamethyldisiloxane (HMDSO). The first organic insulating layer 107 may include a plurality of contact holes. As an example, the first organic insulating layer 107 may include a plurality of contact holes respectively overlapping the first to third drain electrodes D1, D2, and D3.

A connection metal CM may be located on the first organic insulating layer 107. The connection metal CM may include aluminum (Al), copper (Cu), and/or titanium (Ti), and include a single layer or a multi-layer including the above materials. The connection metal CM may be provided in plurality, and the plurality of connection metals CM may be respectively arranged to overlap the first to third drain electrodes D1, D2, and D3. A portion of each of the connection metals CM may be located in the contact hole formed in the first organic insulating layer 107. As an example, the connection metals CM may be respectively in direct contact with the first to third drain electrodes D1, D2, and D3 through contact holes formed in the first organic insulating layer 107.

A second organic insulating layer 109 may be located between the connection metal CM and the sub-pixel electrode 210. The second organic insulating layer 109 may include an organic insulating material such as acryl, benzocyclobutene (BCB), polyimide (PI), or hexamethyldisiloxane (HMDSO). The second organic insulating layer 109 may include contact holes respectively overlapping the contact metals CM.

The first to third sub-pixel electrodes 1210, 2210, and 3210 may be located on the second organic insulating layer 109. The first to third sub-pixel electrodes 1210, 2210, and 3210 may be formed to be reflective electrodes. As an example, the first to third pixel electrodes 1210, 2210, and 3210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In addition, the first to third pixel electrodes 1210, 2210, and 3210 may include a layer formed on the reflective layer, wherein the layer includes an inorganic material such as indium tin oxide (ITO), indium zinc oxide (IZO), zinc oxide (ZnO), or indium oxide ($In_2O_3$). According to some embodiments, the first to third sub-pixel electrodes 1210, 2210, and 3210 may have a structure in which an ITO layer, an Ag layer, and an ITO layer are sequentially stacked. However, the embodiments are not limited thereto and the first to third sub-pixel electrodes 1210, 2210, and 3210 may include various materials, and the structure thereof may include a single layer or a multi-layer and be variously modified.

The first to third pixel electrodes 1210, 2210, and 3210 may be electrically and respectively connected to overlapping connection metals CM through contact holes formed in the second organic insulating layer 109.

According to some embodiments as described with reference to FIG. 2, although the first to third thin-film transistors TFT1, TFT2, and TFT3 are electrically and respectively connected to the first to third pixel electrodes 1210, 2210, and 3210 through the connection metals CM, the embodiments according to the present disclosure are not limited thereto. According to some embodiments, the connection metals CM may be omitted, and one organic insulating layer may be located between the first to third thin-film transistors TFT1, TFT2, and TFT3 and the first to third pixel electrodes 1210, 2210, and 3210. Alternatively, at least three organic insulating layers may be located between the first to third thin-film transistors TFT1, TFT2, and TFT3 and the first to third pixel electrodes 1210, 2210, and 3210. The first to third thin-film transistors TFT1, TFT2, and TFT3 are electrically and respectively connected to the first to third pixel electrodes 1210, 2210, and 3210 through a plurality of connection metals CM.

A subpixel-defining layer 111 may cover an edge region (or an edge) of the first to third sub-pixel electrodes 1210, 2210, and 3210. In other words, the subpixel-defining layer 111 may include a plurality of openings respectively exposing the central portions of the first to third pixel electrodes 1210, 2210, and 3210. As an example, the subpixel-defining layer 111 may include a 3-1 opening 111-OP1 overlapping the first sub-pixel electrode 1210. The subpixel-defining layer 111 may include a 3-2 opening 111-OP2 overlapping the second sub-pixel electrode 2210. The subpixel-defining layer 111 may include a 3-3 opening 111-OP3 overlapping the third sub-pixel electrode 3210.

The openings of the subpixel-defining layer 111 may respectively define emission areas of the first to third sub-pixels P1, P2, and P3. As an example, the 3-1 opening 111-OP1 may define an emission area of the first sub-pixel P1. The 3-2 opening 111-OP2 may define an emission area of the second sub-pixel P2. The 3-3 opening 111-OP3 may define an emission area of the third sub-pixel P3.

Figure 3:
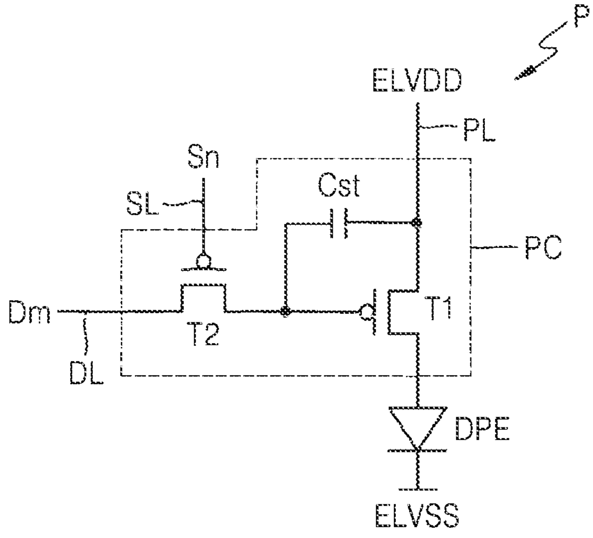
FIG. 3 is a schematic equivalent circuit diagram of a sub-pixel of a display apparatus according to some embodiments.

FIG. 3 is a schematic equivalent circuit diagram of a sub-pixel P of a display apparatus according to some embodiments.

The sub-pixel P of FIG. 3 corresponds to, for example, each of the first to third sub-pixels P1, P2, and P3 shown in FIG. 2.

The sub-pixel P may include a sub-pixel circuit PC and the display element DPE connected to the sub-pixel circuit PC. The sub-pixel circuit PC may include a driving thin-film transistor T1, a switching thin-film transistor T2, and a storage capacitor Cst. The sub-pixel P may be configured to emit light of a specific color from the display element DPE. As an example, the sub-pixel P may be configured to emit, for example, red, green, or blue light, or emit red, green, blue, or white light by using the display element DPE.

The switching thin-film transistor T2 is connected to a scan line SL and a data line DL, and configured to transfer a data voltage or a data signal Dm to the driving thin-film transistor T1 according to a scan voltage or a scan signal Sn input from the scan line SL, the data voltage or the data signal Dm being input from the data line DL.

The storage capacitor Cst may be connected to the switching thin-film transistor T2 and a driving voltage line PL and configured to store a voltage corresponding to a difference between a voltage transferred from the switching thin-film transistor T2 and a first power voltage ELVDD supplied to the driving voltage line PL.

The driving thin-film transistor T1 may be connected to the driving voltage line PL and the storage capacitor Cst and configured to control a driving current according to the voltage stored in the storage capacitor Cst, the driving current flowing from the driving voltage line PL to the display element DPE. The display element DPE may be configured to emit light having a preset brightness based on the driving current. An opposite electrode (e.g., a cathode) of the display element DPE may be configured to receive a second power voltage ELVSS.

Although it is shown in FIG. 3 that the sub-pixel circuit PC includes two thin-film transistors and one storage capacitor, the embodiments according to the present disclosure are not limited thereto and the sub-pixel circuit PC may include three or more thin-film transistors.

Figure 4:
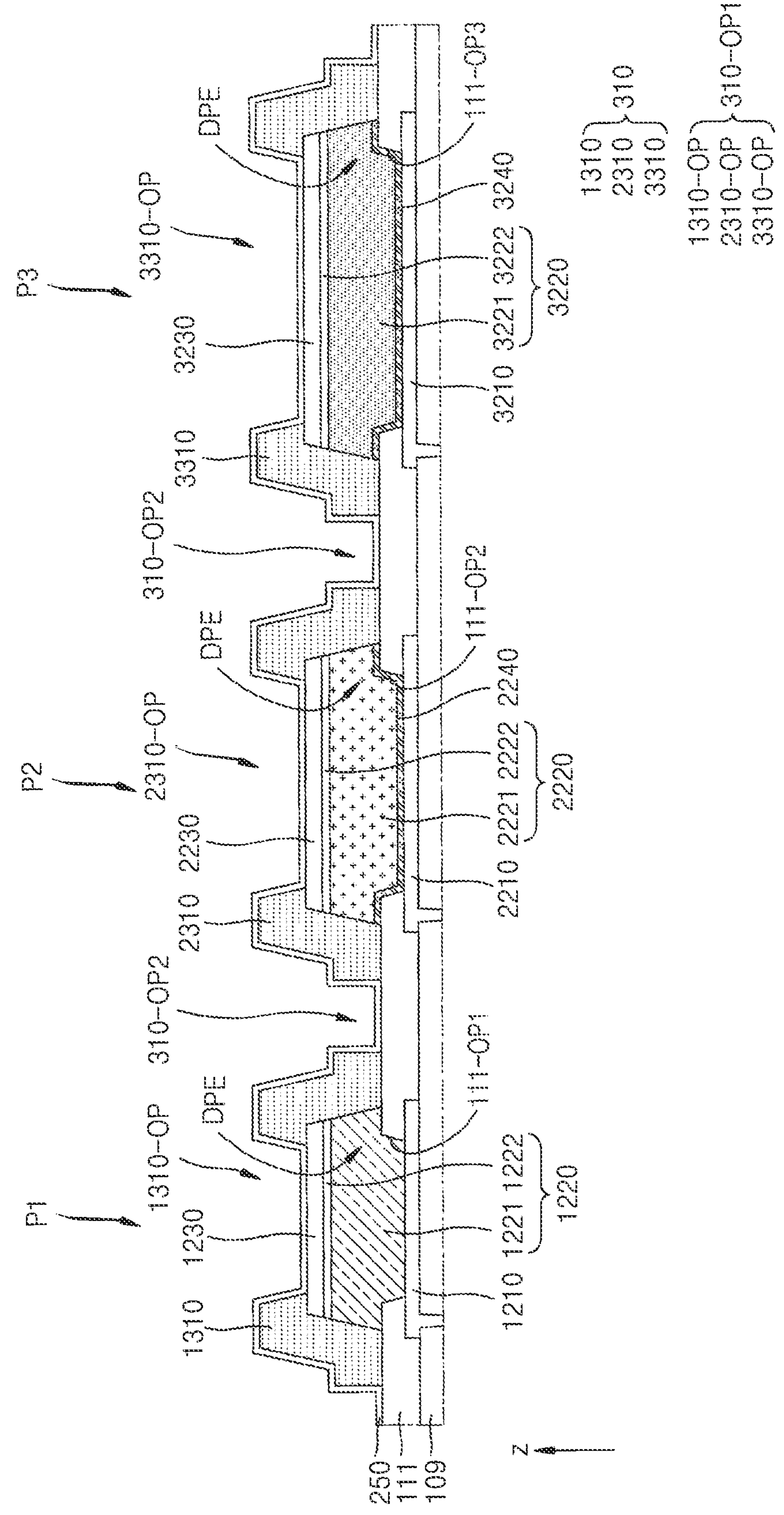
FIG. 4 is a schematic cross-sectional view of a portion of a display apparatus according to some embodiments.

FIG. 4 is a schematic cross-sectional view of a portion of a display apparatus according to some embodiments.

FIG. 4 is a cross-sectional view of the display element DPE described above with reference to FIG. 2 according to some embodiments. The display element DPE corresponding to the first sub-pixel P1 may include the first sub-pixel electrode 1210 and a first stack 1220 on the first sub-pixel electrode 1210. The display element DPE corresponding to the second sub-pixel P2 may include the second sub-pixel electrode 2210 and a second stack 2220 on the second sub-pixel electrode 2210. The display element DPE corresponding to the third sub-pixel P3 may include the third sub-pixel electrode 3210 and a third stack 3220 on the third sub-pixel electrode 3210.

Referring to FIG. 4, the first to third sub-pixel electrodes 1210, 2210, and 3210 of the display elements DPE may be arranged to be spaced apart from each other on the second organic insulating layer 109.

The subpixel-defining layer 111 may be arranged to cover the edges of the first to third sub-pixel electrodes 1210, 2210, and 3210. In other words, the subpixel-defining layer 111 may include a plurality of openings respectively exposing the central portions of the first to third sub-pixel electrodes 1210, 2210, and 3210.

The first to third stacks 1220, 2220, and 3220 may be apart from each other and respectively located on the first to third sub-pixel electrodes 1210, 2210, and 3210. As an example, the first stack 1220 may be located on the first sub-pixel electrode 1210. The second stack 2220 may be located on the second sub-pixel electrode 2210. The third stack 3220 may be located on the third sub-pixel electrode 3210.

The first stack 1220 may include a first emission layer 1221 and a first opposite electrode 1222 on the first emission layer 1221. The second stack 2220 may include a second emission layer 2221 and a second opposite electrode 2222 on the second emission layer 2221. The third stack 3220 may include a third emission layer 3221 and a third opposite electrode 3222 on the third emission layer 3221.

The first to third emission layers 1221, 2221, and 3221 may be respectively located on the first to third sub-pixel electrodes 1210, 2210, and 3210.

As an example, the first emission layer 1221 may be located on the first sub-pixel electrode 1210. The second emission layer 2221 may be located on the second sub-pixel electrode 2210. The third emission layer 3221 may be located on the third sub-pixel electrode 3210.

Portions of the first to third emission layers 1221, 2221, and 3221 may be respectively located in the 3-1 to 3-3 openings 111-OP1, 111-OP2, and 111-OP3 of the subpixel-defining layer 111.

As an example, a portion of the first emission layer 1221 may be located in the 3-1 opening 111-OP1 of the subpixel-defining layer 111. Another portion of the first emission layer 1221 may overlap the edge region (or the edge) of the first sub-pixel electrode 1210 and be located on the subpixel-defining layer 111. A portion of the second emission layer 2221 may be located in the 3-2 opening 111-OP2 of the subpixel-defining layer 111. Another portion of the second emission layer 2221 may overlap the edge region (or the edge) of the second sub-pixel electrode 2210 and be located on the subpixel-defining layer 111. A portion of the third emission layer 3221 may be located in the 3-3 opening 111-OP3 of the subpixel-defining layer 111. Another portion of the third emission layer 3221 may overlap the edge region (or the edge) of the third sub-pixel electrode 3210 and be located on the subpixel-defining layer 111.

The first to third emission layers 1221, 2221, and 3221 may include an organic material configured to emit light of a preset color. According to some embodiments, the first to third emission layers 1221, 2221, and 3221 may include an inorganic material.

The first to third emission layers 1221, 2221, and 3221 may include a material configured to emit light of different colors. According to some embodiments, the first emission layer 1221 may include a material configured to emit red light, the second emission layer 2221 may include a material configured to emit green light, and the third emission layer 3221 may include a material configured to emit blue light.

According to some embodiments, a common layer may be additionally located on and/or under the first to third emission layers 1221, 2221, and 3221, wherein the common layer includes a hole injection layer, a hole transport layer, an electron transport layer, and/or an electron injection layer. According to some embodiments, a common layer including a hole injection layer and/or a hole transport layer may be located under each of the first to third emission layers 1221, 2221, and 3221. According to some embodiments, a common layer including an electron transport layer and/or an electron injection layer may be located on each of the first to third emission layers 1221, 2221, and 3221. According to some embodiments, a first common layer including a hole injection layer and/or a hole transport layer may be located under each of the first to third emission layers 1221, 2221, and 3221, and a second common layer including an electron transport layer and/or an electron injection layer may be located on each of the first to third emission layers 1221, 2221, and 3221.

The first to third opposite electrodes 1222, 2222, and 3222 may be located on the first to third emission layers 1221, 2221, and 3221. As an example, the first opposite electrode 1222 may be located on the first emission layer 1221. The second opposite electrode 2222 may be located on the second emission layer 2221. The third opposite electrode 3222 may be located on the third emission layer 3221.

The first to third opposite electrodes 1222, 2222, and 3222 may include a conductive material having a small work function. As an example, the first to third opposite electrodes 1222, 2222, and 3222 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the first to third opposite electrodes 1222, 2222, and 3222 may further include a layer including ITO, IZO, ZnO, or $In_2O_3$ on the (semi) transparent layer including the above materials.

Although it is shown in FIG. 4 that the first to third stacks 1220, 2220, and 3220 include a lateral surface tapered with respect to the upper surface of the subpixel-defining layer 111, the embodiments according to the present disclosure are not limited thereto. According to some embodiments, the first to third stacks 1220, 2220, and 3220 include a lateral surface forming a right angle with respect to the upper surface of the subpixel-defining layer 111.

1-1 to 1-3 auxiliary layers 1230, 2230, and 3230 may be located on the first to third stacks 1220, 2220, and 3220. As an example, the 1-1 auxiliary layer 1230 may be located on the first stack 1220. The 1-2 auxiliary layer 2230 may be located on the second stack 2220. The 1-3 auxiliary layer 3230 may be located on the third stack 3220.

The 1-1 to 1-3 auxiliary layers 1230, 2230, and 3230 may be in direct contact with the first to third opposite electrodes 1222, 2222, and 3222. As an example, the 1-1 auxiliary layer 1230 may be located on and in direct contact with the first opposite electrode 1222. The 1-2 auxiliary layer 2230 may be located on and in direct contact with the second opposite electrode 2222. The 1-3 auxiliary layer 3230 may be located on and in direct contact with the third opposite electrode 3222.

The 1-1 to 1-3 auxiliary layers 1230, 2230, and 3230 may have a light transmittance and conductivity. As an example, the 1-1 to 1-3 auxiliary layers 1230, 2230, and 3230 may include a transparent conductive oxide. According to some embodiments, the 1-1 to 1-3 auxiliary layers 1230, 2230, and 3230 may include a transparent conductive oxide such as indium tin oxide (ITO) and/or indium zinc oxide (IZO).

A first encapsulation layer 310 may be located on the subpixel-defining layer 111. The first encapsulation layer 310 may include 1-1 to 1-3 encapsulation layers 1310, 2310, and 3310 partially overlapping the first to third sub-pixel electrodes 1210, 2210, and 3210, respectively.

As an example, the 1-1 encapsulation layer 1310 may partially overlap the first sub-pixel electrode 1210 and be located on the subpixel-defining layer 111. The 1-2 encapsulation layer 2310 may partially overlap the second sub-pixel electrode 2210 and be located on the subpixel-defining layer 111. The 1-3 encapsulation layer 3310 may partially overlap the third sub-pixel electrode 3210 and be located on the subpixel-defining layer 111.

The first encapsulation layer 310 may include first openings 310-OP1 respectively overlapping the first to third sub-pixel electrodes 1210, 2210, and 3210.

As an example, a 1-1 opening 1310-OP may be formed in the 1-1 encapsulation layer 1310 to overlap the first sub-pixel electrode 1210. A 1-2 opening 2310-OP may be formed in the 1-2 encapsulation layer 2310 to overlap the second sub-pixel electrode 2210. A 1-3 opening 3310-OP may be formed in the 1-3 encapsulation layer 3310 to overlap the third sub-pixel electrode 3210.

The 1-1 to 1-3 openings 1310-OP, 2310-OP, and 3310-OP may be penetration holes penetrating the first encapsulation layer 310. The 1-1 to 1-3 openings 1310-OP, 2310-OP, and 3310-OP may expose a portion of the upper surface of the 1-1 to 1-3 auxiliary layers 1230, 2230, and 3230. As an example, the 1-1 opening 1310-OP may expose the central portion of the upper surface of the 1-1 auxiliary layer 1230. The 1-2 opening 2310-OP may expose the central portion of the upper surface of the 1-2 auxiliary layer 2230. The 1-3 opening 3310-OP may expose the central portion of the upper surface of the 1-3 auxiliary layer 3230.

The 1-1 to 1-3 encapsulation layers 1310, 2310, and 3310 may cover a portion of the first to third stacks 1220, 2220, and 3220 and cover a portion of the 1-1 to 1-3 auxiliary layers 1230, 2230, and 3230.

As an example, the upper surface of the first stack 1220 may be covered by the 1-1 auxiliary layer 1230. Each lateral surface of the first stack 1220 may be covered by the 1-1 encapsulation layer 1310. Each lateral surface of the 1-1 auxiliary layer 1230 may be covered by the 1-1 encapsulation layer 1310. An edge region (or an edge) of the upper surface of the 1-1 auxiliary layer 1230 may be covered by the 1-1 encapsulation layer 1310. A region (e.g., a central region) of the upper surface of the 1-1 auxiliary layer 1230 not covered by the 1-1 encapsulation layer 1310 may overlap the 1-1 opening 1310-OP. The 1-1 encapsulation layer 1310 may be in direct contact with the first stack 1220 and the 1-1 auxiliary layer 1230.

The 1-1 auxiliary layer 1230 and the 1-1 encapsulation layer 1310 may be configured to prevent the first stack 1220 from being exposed to external air. Particularly, the 1-1 auxiliary layer 1230 and the 1-1 encapsulation layer 1310 may be configured to prevent moisture transmission to the first opposite electrode 1222, thereby preventing oxidation of a metal material included in the first opposite electrode 1222.

The upper surface of the second stack 2220 may be covered by the 1-2 auxiliary layer 2230. Each lateral surface of the second stack 2220 may be covered by the 1-2 encapsulation layer 2310. Each lateral surface of the 1-2 auxiliary layer 2230 may be covered by the 1-2 encapsulation layer 2310. An edge region (or an edge) of the upper surface of the 1-2 auxiliary layer 2230 may be covered by the 1-2 encapsulation layer 2310. A region (e.g., a central region) of the upper surface of the 1-2 auxiliary layer 2230 not covered by the 1-2 encapsulation layer 2310 may overlap the 1-2 opening 2310-OP. The 1-2 encapsulation layer 2310 may be in direct contact with the second stack 2220 and the 1-2 auxiliary layer 2230.

The 1-2 auxiliary layer 2230 and the 1-2 encapsulation layer 2310 may be configured to prevent the second stack 2220 from being exposed to external air. Particularly, the 1-2 auxiliary layer 2230 and the 1-2 encapsulation layer 2310 may be configured to prevent moisture transmission to the second opposite electrode 2222, thereby preventing oxidation of a metal material included in the second opposite electrode 2222.

The upper surface of the third stack 3220 may be covered by the 1-3 auxiliary layer 3230. Each lateral surface of the third stack 3220 may be covered by the 1-3 encapsulation layer 3310. Each lateral surface of the 1-3 auxiliary layer 3230 may be covered by the 1-3 encapsulation layer 3310. An edge region (or an edge) of the upper surface of the 1-3 auxiliary layer 3230 may be covered by the 1-3 encapsulation layer 3310. A region (e.g., a central region) of the upper surface of the 1-3 auxiliary layer 3230 not covered by the 1-3 encapsulation layer 3310 may overlap the 1-3 opening 3310-OP. The 1-3 encapsulation layer 3310 may be in direct contact with the third stack 3220 and the 1-3 auxiliary layer 3230.

The 1-3 auxiliary layer 3230 and the 1-3 encapsulation layer 3310 may be configured to prevent the third stack 3220 from being exposed to external air. Particularly, the 1-3 auxiliary layer 3230 and the 1-3 encapsulation layer 3310 may be configured to prevent moisture transmission to the third opposite electrode 3222, thereby preventing oxidation of a metal material included in the third opposite electrode 3222.

The first encapsulation layer 310 may include a second opening 310-OP2 located between adjacent two of the 1-1 to 1-3 encapsulation layers 1310, 2310, and 3310.

As an example, the second opening 310-OP2 may be located between the 1-1 encapsulation layer 1310 and the 1-2 encapsulation layer 2310 and between the 1-2 encapsulation layer 2310 and the 1-3 encapsulation layer 3310.

The second opening 310-OP2 may be a penetration hole penetrating the 1-1 encapsulation layer 310. Accordingly, a portion of the subpixel-defining layer 111 may be exposed through the second opening 310-OP2. As an example, a portion of the subpixel-defining layer 111 may be exposed in a region between the first and second sub-pixel electrodes 1210 and 2210 through the second opening 310-OP2 located between the 1-1 and 1-2 encapsulation layers 1310 and 2310. A portion of the subpixel-defining layer 111 may be exposed in a region between the second and third sub-pixel electrodes 2210 and 3210 through the second opening 310-OP2 located between the 1-2 and 1-3 encapsulation layers 2310 and 3310.

In other words, the 1-1 to 1-3 encapsulation layers 1310, 2310, and 3310 may be apart from each other. As an example, the 1-1 encapsulation layer 1310 and the 1-2 encapsulation layer 2310 may be apart from each other with the second opening 310-OP2 therebetween and located on the subpixel-defining layer 111. The 1-2 encapsulation layer 2310 and the 1-3 encapsulation layer 3310 may be apart from each other with the second opening 310-OP2 therebetween and located on the subpixel-defining layer 111.

The first encapsulation layer 310 may include an inorganic insulating material. As an example, the first encapsulation layer 310 may include an inorganic insulating material such as silicon oxide ($SiO_x$), silicon nitride ($SiN_x$), and/or silicon oxynitride (SiON).

2-2 and 2-3 auxiliary layers 2240 and 3240 may be respectively located on the second and third sub-pixel electrodes 2210 and 3210. As an example, the 2-2 auxiliary layer 2240 may be located between the second sub-pixel electrode 2210 and the second stack 2220 (or the second emission layer 2221). The 2-3 auxiliary layer 3240 may be located between the third sub-pixel electrode 3210 and the third stack 3220 (or the third emission layer 3221).

A portion of the 2-2 auxiliary layer 2240 may overlap the second sub-pixel electrode 2210. As an example, the central region of the 2-2 auxiliary layer 2240 may be located in the 3-2 opening 111-OP2 of the subpixel-defining layer 111 and may overlap the central region of the second sub-pixel electrode 2210. In this case, the 2-2 auxiliary layer 2240 may be in direct contact with the second sub-pixel electrode 2210.

An edge region (or an edge) of the 2-2 auxiliary layer 2240 may overlap the edge region (or the edge) of the second sub-pixel electrode 2210 and be located on the subpixel-defining layer 111. That is, an edge region (or an edge) of the 2-2 auxiliary layer 2240 may be located on the upper surface of the subpixel-defining layer 111 covering the edge region (or the edge) of the second sub-pixel electrode 2210. In other words, a portion of the subpixel-defining layer 111 may be arranged between an edge region (or an edge) of the 2-2 auxiliary layer 2240 and the edge region (or the edge) of the second sub-pixel electrode 2210.

A portion of the 2-3 auxiliary layer 3240 may overlap the third sub-pixel electrode 3210. As an example, the central region of the 2-3 auxiliary layer 3240 may be located in the 3-3 opening 111-OP3 of the subpixel-defining layer 111 and may overlap the central region of the third sub-pixel electrode 3210. In this case, the 2-3 auxiliary layer 3240 may be in direct contact with the third sub-pixel electrode 3210.

An edge region (or an edge) of the 2-3 auxiliary layer 3240 may overlap the edge region (or the edge) of the third sub-pixel electrode 3210 and be located on the subpixel-defining layer 111. That is, an edge region (or an edge) of the 2-3 auxiliary layer 3240 may be located on the upper surface of the subpixel-defining layer 111 covering the edge region (or the edge) of the third sub-pixel electrode 3210. In other words, a portion of the subpixel-defining layer 111 may be arranged between an edge region (or an edge) of the 2-3 auxiliary layer 3240 and the edge region (or the edge) of the third sub-pixel electrode 3210.

An auxiliary layer may not be located between the first stack 1220 (or the first emission layer 1221) and the first sub-pixel electrode 1210. That is, the first emission layer 1221 may be in direct contact with the first sub-pixel electrode 1210.

In other words, the number of layers located between the first sub-pixel electrode 1210 and the first opposite electrode 1222 may be different from the number of layers located between the second sub-pixel electrode 2210 and the second opposite electrode 2222. According to some embodiments, because a portion of the subpixel-defining layer 111 and the first emission layer 1221 may be located between the first sub-pixel electrode 1210 and the first opposite electrode 1222, two layers may be located. Because a portion of the subpixel-defining layer 111, the second emission layer 2221, and the 2-2 auxiliary layer 2240 may be located between the second sub-pixel electrode 2210 and the second opposite electrode 2222, three layers may be located.

The lateral surface of the 2-2 and 2-3 auxiliary layers 2240 and 3240 may be covered by the 1-2 and 1-3 encapsulation layers 2310 and 3310.

As an example, the upper surface of the 2-2 auxiliary layer 2240 may be covered by the second emission layer 2221. Each lateral surface of the 2-2 auxiliary layer 2240 may be covered by the 1-2 encapsulation layer 2310. In this case, the 2-2 auxiliary layer 2240 may be in direct contact with the second emission layer 2221 and the 1-2 encapsulation layer 2310.

The upper surface of the 2-3 auxiliary layer 3240 may be covered by the third emission layer 3221. Each lateral surface of the 2-3 auxiliary layer 3240 may be covered by the 1-3 encapsulation layer 3310. In this case, the 2-3 auxiliary layer 3240 may be in direct contact with the third emission layer 3221 and the 1-3 encapsulation layer 3310.

The 2-2 and 2-3 auxiliary layers 2240 and 3240 may include a metal material. As an example, the 2-2 and 2-3 auxiliary layers 2240 and 3240 may include a metal oxide. According to some embodiments, the 2-2 and 2-3 auxiliary layers 2240 and 3240 may include a metal oxide such as aluminum oxide ($AlO_x$), molybdenum oxide ($MoO_x$), and/or tungsten oxide ($WO_x$).

A common electrode 250 may be located on the first encapsulation layer 310. As an example, the common electrode 250 may be arranged to cover the 1-1 to 1-3 encapsulation layers 1310, 2310, and 3310. In this case, the common electrode 250 may be in direct contact with the 1-1 to 1-3 encapsulation layers 1310, 2310, and 3310.

The common electrode 250 may be integrally formed while covering the 1-1 to 1-3 encapsulation layers 1310, 2310, and 3310 entirely.

As an example, a portion of the common electrode 250 may be located in the 1-1 to 1-3 openings 1310-OP, 2310-OP, and 3310-OP. A portion of the common electrode 250 located in the 1-1 to 1-3 openings 1310-OP, 2310-OP, and 3310-OP may be in direct contact with the 1-1 to 1-3 auxiliary layers 1230, 2230, and 3230.

In other words, the 1-1 to 1-3 auxiliary layers 1230, 2230, and 3230 may be respectively located between the first to third stacks 1220, 2220, and 3220 and the common electrode 250.

As an example, the 1-1 auxiliary layer 1230 may be located between the first stack 1220 and the common electrode 250. The 1-2 auxiliary layer 2230 may be located between the second stack 2220 and the common electrode 250. The 1-3 auxiliary layer 3230 may be located between the third stack 3220 and the common electrode 250.

A portion of the common electrode 250 may be located in the second opening 310-OP2. As an example, a portion of the common electrode 250 may be located in the second opening 310-OP2 formed between the 1-1 and 1-2 encapsulation layers 1310 and 2310. A portion of the common electrode 250 may be located in the second opening 310-OP2 formed between the 1-2 and 1-3 encapsulation layers 2310 and 3310. In this case, the common electrode 250 may be in direct contact with the subpixel-defining layer 111.

The common electrode 250 may have a light transmittance and conductivity. As an example, the common electrode 250 may include a transparent conductive oxide. According to some embodiments, the common electrode 250 may include a transparent conductive oxide such as indium tin oxide (ITO) and/or indium zinc oxide (IZO).

The common electrode 250 may have conductivity and be integrally formed. The common electrode 250 may be in direct contact with the 1-1 to 1-3 auxiliary layers 1230, 2230, and 3230, and the 1-1 to 1-3 auxiliary layers 1230, 2230, and 3230 may be in direct contact with the first to third opposite electrodes 1222, 2222, and 3222. Accordingly, the first to third opposite electrodes 1222, 2222, and 3222 may be electrically connected to each other through the common electrode 250 and the 1-1 to 1-3 auxiliary layers 1230, 2230, and 3230. Through this, the same voltage may be applied to the first to third opposite electrodes 1222, 2222, and 3222.

Figure 5:
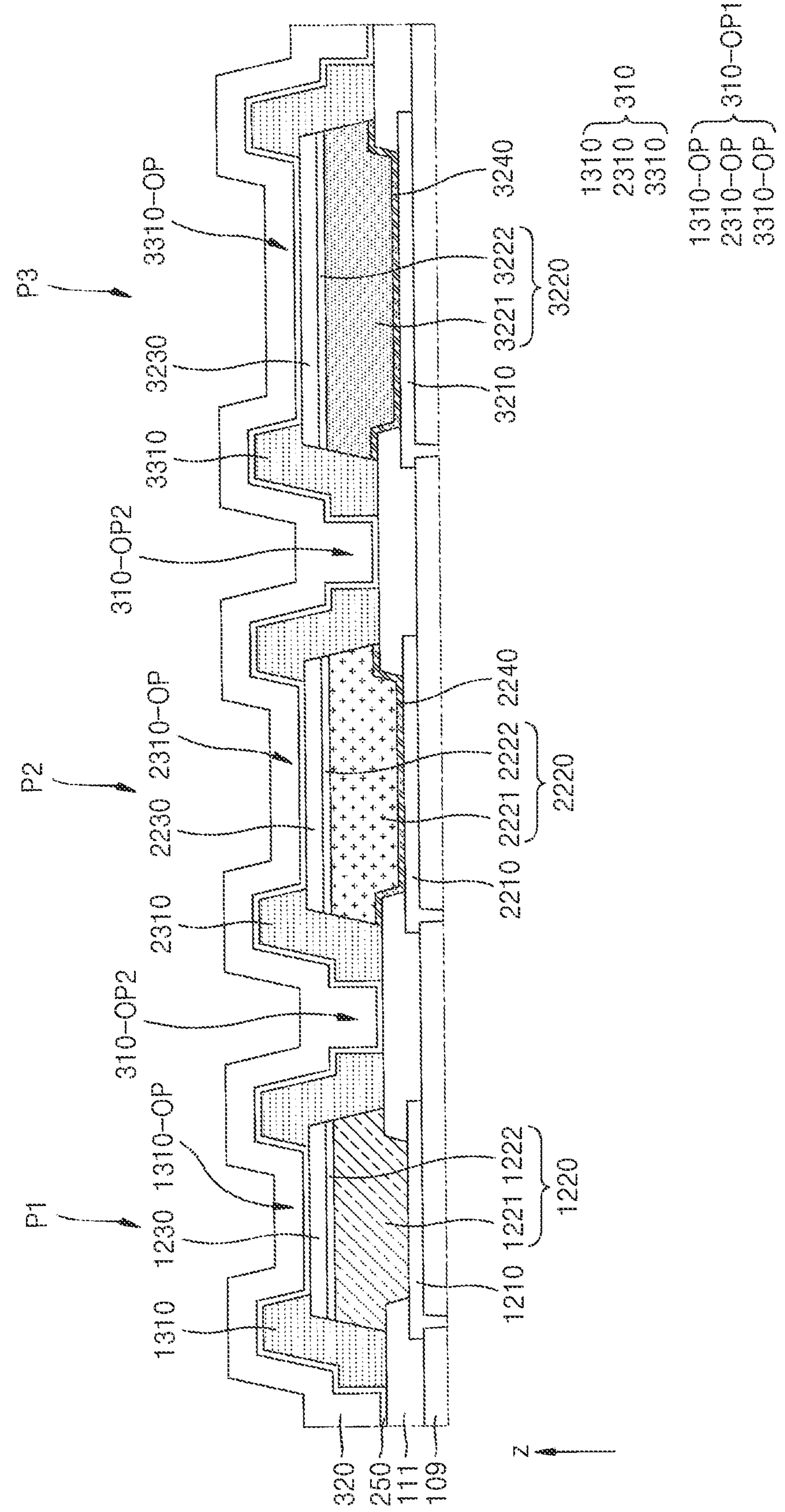
FIG. 5 is a schematic cross-sectional view of a portion of a display apparatus according to some embodiments.

FIG. 5 is a schematic cross-sectional view of a portion of a display apparatus according to some embodiments.

Referring to FIG. 5, a second encapsulation layer 320 may be further utilized in the embodiments shown with respect to FIG. 4.

The second encapsulation layer 320 may cover the common electrode 250. In this case, the second encapsulation layer 320 may be in direct contact with the common electrode 250.

A portion of the second encapsulation layer 320 may be located in the 1-1 to 1-3 openings 1310-OP, 2310-OP, and 3310-OP. The second encapsulation layer 320 may fill at least a portion of the 1-1 to 1-3 openings 1310-OP, 2310-OP, and 3310-OP.

According to some embodiments, the second encapsulation layer 320 may fill at least a portion (e.g., all) of the 1-1 opening 1310-OP. The second encapsulation layer 320 may fill at least a portion (e.g., all) of the 1-2 opening 2310-OP. The second encapsulation layer 320 may fill at least a portion (e.g., all) of the 1-3 opening 3310-OP.

A portion of the second encapsulation layer 320 may be located in the second opening 310-OP2. The second encapsulation layer 320 may fill at least a portion (e.g., all) of the second opening 310-OP2.

As an example, a portion of the second encapsulation layer 320 may be located in a space between the 1-1 encapsulation layer 1310 and the 1-2 encapsulation layer 2310 and may fill at least a portion (e.g., all) of the second opening 310-OP2. A portion of the second encapsulation layer 320 may be located in a space between the 1-2 encapsulation layer 2310 and the 1-3 encapsulation layer 3310 and may fill at least a portion (e.g., all) of the second opening 310-OP2.

The second encapsulation layer 320 may include an inorganic insulating material. As an example, the second encapsulation layer 320 may include an inorganic insulating material such as silicon oxide ($SiO_x$), silicon nitride ($SiN_x$), and/or silicon oxynitride (SiON). According to some embodiments, the second encapsulation layer 320 may include the same material as the first encapsulation layer 310. According to some embodiments, the second encapsulation layer 320 may include a material different from the first encapsulation layer 310.

Figure 6:
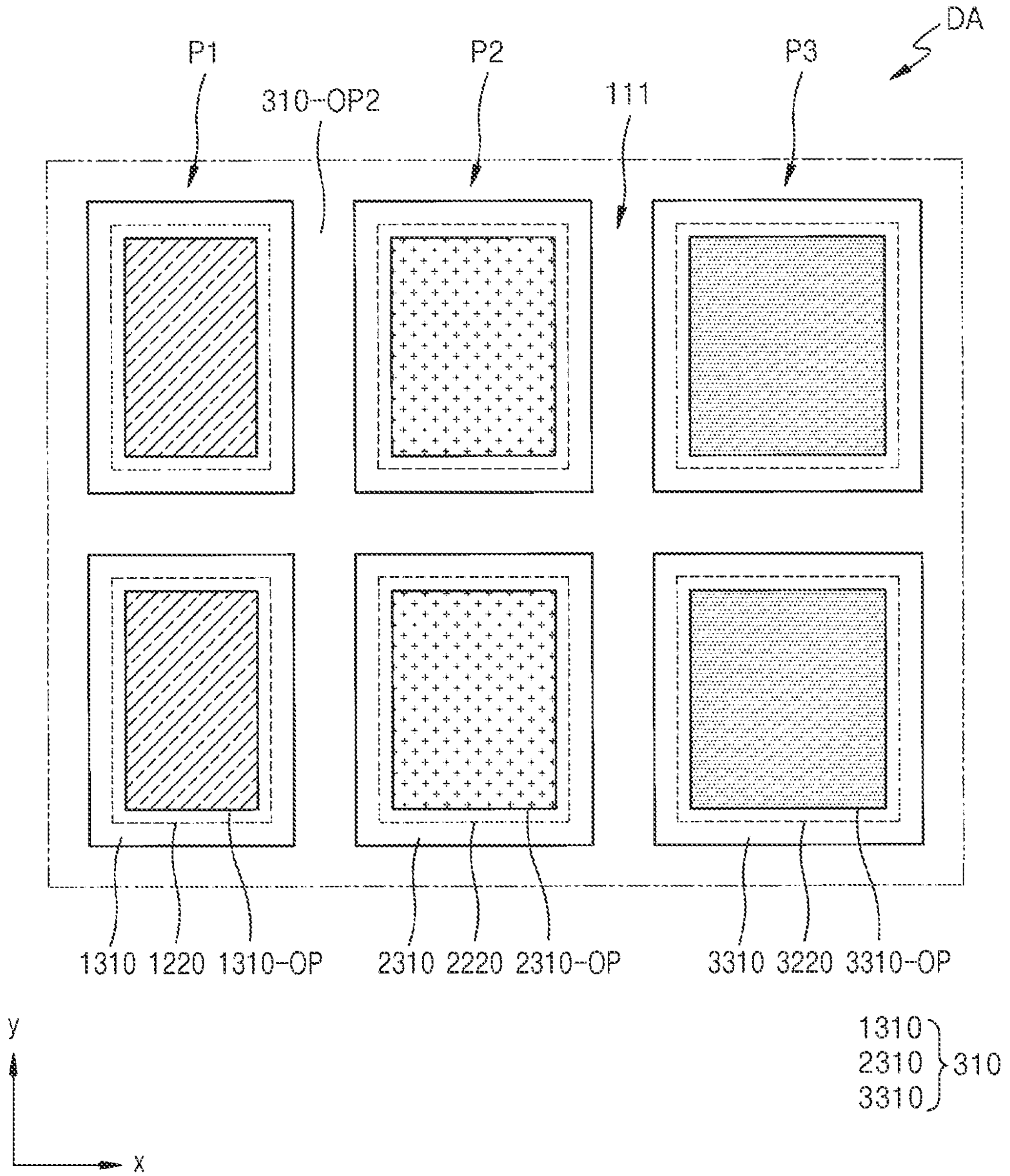
FIG. 6 is a schematic enlarged plan view of a portion of a display apparatus according to some embodiments.

FIG. 6 is a schematic enlarged plan view of a display apparatus according to some embodiments.

The first to third sub-pixels P1, P2, and P3 each including the display element and the first encapsulation layer 310 may be arranged in the display area DA.

The first to third sub-pixels P1, P2, and P3 may respectively include the first to third stacks 1220, 2220, and 3220 each including the emission layer.

The first sub-pixel P1 may include the first stack 1220 including the emission layer. The second sub-pixel P2 may include the second stack 2220 including the emission layer. The third sub-pixel P3 may include the third stack 3220 including the emission layer.

The first to third sub-pixels P1, P2, and P3 may be respectively configured to emit light of different colors.

According to some embodiments, the first stack 1220 may include a material configured to emit red light, and the first sub-pixel P1 may be configured to emit red light. The second stack 2220 may include a material configured to emit green light, and the second sub-pixel P2 may be configured to emit green light. The third stack 3220 may include a material configured to emit blue light, and the third sub-pixel P3 may be configured to emit blue light.

The first encapsulation layer 310 may include 1-1 to 1-3 encapsulation layers 1310, 2310, and 3310 respectively surrounding the first to third stacks 1220, 2220, and 3220.

The 1-1 encapsulation layer 1310 may have a shape surrounding the first stack 1220. The 1-2 encapsulation layer 2310 may have a shape surrounding the second stack 2220. The 1-3 encapsulation layer 3310 may have a shape surrounding the third stack 3220. As an example, the 1-1 to 1-3 encapsulation layers 1310, 2310, and 3310 may each have a frame shape in a plan view.

The 1-1 to 1-3 encapsulation layers 1310, 2310, and 3310 may respectively include the 1-1 to 1-3 openings 1310-OP, 2310-OP, 3310-OP respectively exposing portions of the first to third stacks 1220, 2220, and 3220.

As an example, the 1-1 encapsulation layer 1310 may include the 1-1 opening 1310-OP overlapping the central portion of the first stack 1220. The 1-2 encapsulation layer 2310 may include the 1-2 opening 2310-OP overlapping the central portion of the second stack 2220. The 1-3 encapsulation layer 3310 may include the 1-3 opening 3310-OP overlapping the central portion of the third stack 3220.

Portions of the 1-1 to 1-3 encapsulation layers 1310, 2310, and 3310 may respectively overlap portions of the first to third stacks 1220, 2220, and 3220.

As an example, an edge region (or an edge) of the first stack 1220 may overlap an inner edge region (or an edge) of the 1-1 encapsulation layer 1310 adjacent to the 1-1 opening 1310-OP. An edge region (or an edge) of the second stack 2220 may overlap an inner edge region (or an edge) of the 1-2 encapsulation layer 2310 adjacent to the 1-2 opening 2310-OP. An edge region (or an edge) of the third stack 3220 may overlap an inner edge region (or an edge) of the 1-3 encapsulation layer 3310 adjacent to the 1-3 opening 3310-OP.

The 1-1 to 1-3 encapsulation layers 1310, 2310, and 3310 may be apart from each other. In other words, the 1-1 to 1-3 encapsulation layers 1310, 2310, and 3310 may each have an isolated shape or an island shape.

The first encapsulation layer 310 may include the second opening 310-OP2 located between adjacent two of the 1-1 to 1-3 encapsulation layers 1310, 2310, and 3310.

In a plan view, the second opening 310-OP2 may have a net (or mesh) structure. As an example, the second opening 310-OP2 may have a net (or mesh) structure surrounding respective portions (e.g., the 1-1 to 1-3 encapsulation layers 1310, 2310, and 3310) of the first encapsulation layer 310. Alternatively, the second opening 310-OP2 has a net (or mesh) structure, and respective portions of the first encapsulation layer 310 may be located in respective holes (e.g., the 1-1 to 1-3 encapsulation layers 1310, 2310, and 3310) of the net (or mesh) structure of the second opening 310-OP2.

According to some embodiments, a portion of the second opening 310-OP2 may be located in a space between the 1-1 encapsulation layer 1310 and the 1-2 encapsulation layer 2310 adjacent to each other. A portion of the second opening 310-OP2 may be located in a space between the 1-2 encapsulation layer 2310 and the 1-3 encapsulation layer 3310 adjacent to each other.

As shown in FIG. 6, the first to third sub-pixels P1, P2, and P3 may each be provided in plurality, and the 1-1 to 1-3 encapsulation layers 1310, 2310, and 3310 respectively surrounding the first to third sub-pixels P1, P2, and P3 may be provided in plurality. In this case, the second opening 310-OP2 may be located between the first encapsulation layers 310 adjacent to each other. As an example, a portion of the second opening 310-OP2 may be located between a portion (e.g., the 1-1 encapsulation layer 1310) of the first encapsulation layer 310 surrounding the first sub-pixel P1 and a portion (e.g., the 1-1 encapsulation layer 1310) of the first encapsulation layer 310 surrounding another sub-pixel arranged in a −y direction of the first sub-pixel P1.

A portion of the subpixel-defining layer 111 may be exposed through a separated space between the 1-1 to 1-3 encapsulation layers 1310, 2310, and 3310, or the second opening 310-OP2.

Although it is shown in FIG. 6 that the shapes of the first to third sub-pixels P1, P2, and P3, and the 1-1 to 1-3 encapsulation layers 1310, 2310, and 3310 are approximately quadrangular shapes with angled corners, the embodiments according to the present disclosure are not limited thereto. According to some embodiments, the first to third sub-pixels P1, P2, and P3, and the 1-1 to 1-3 encapsulation layers 1310, 2310, and 3310 may each have a shape such as an N-gon (N is a natural number of 3 or more) or an elliptical shape, or a shape with round corners. However, the shape may be modified variously.

Figure 7A:
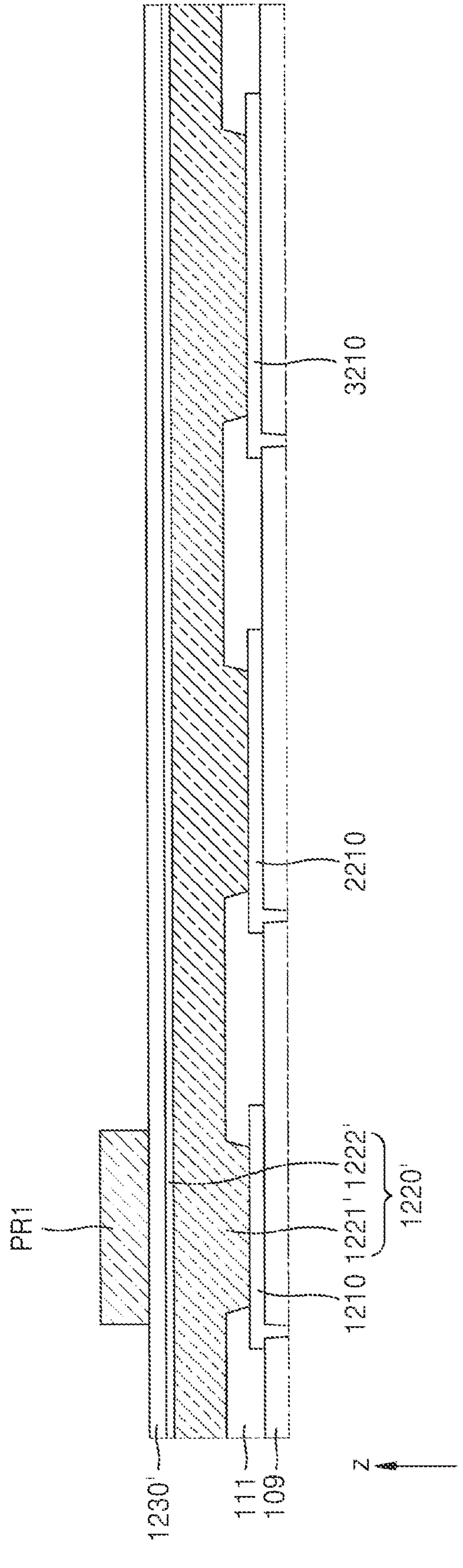
FIGS. 7A to 7P are schematic cross-sectional views showing states corresponding to a process of manufacturing a display apparatus according to some embodiments.
Figure 7B:
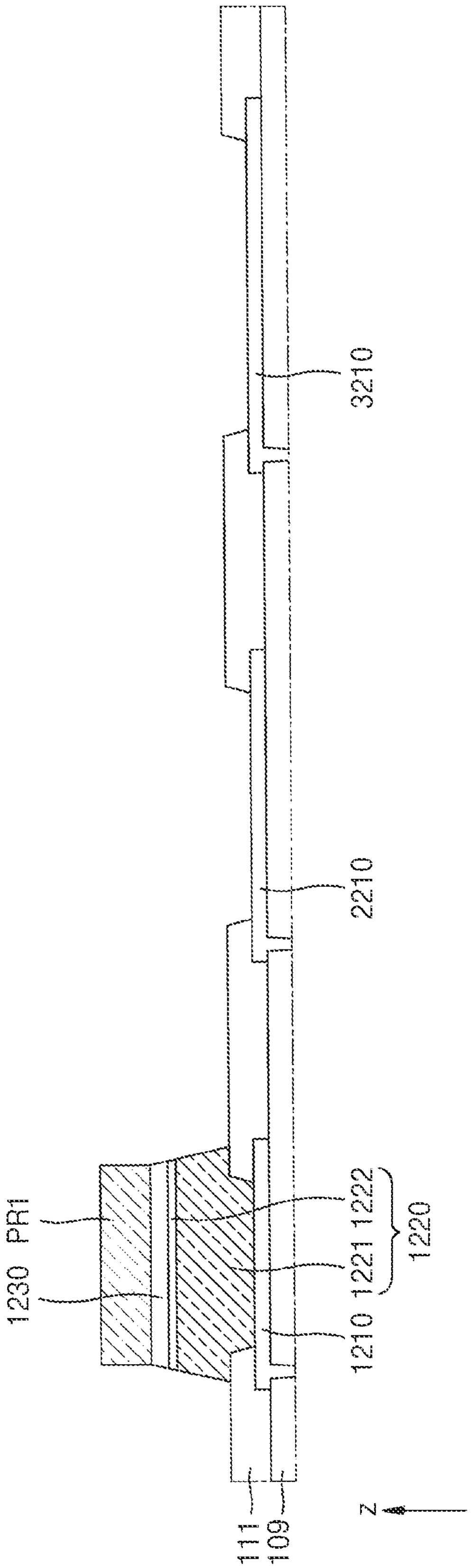
Figure 7C:
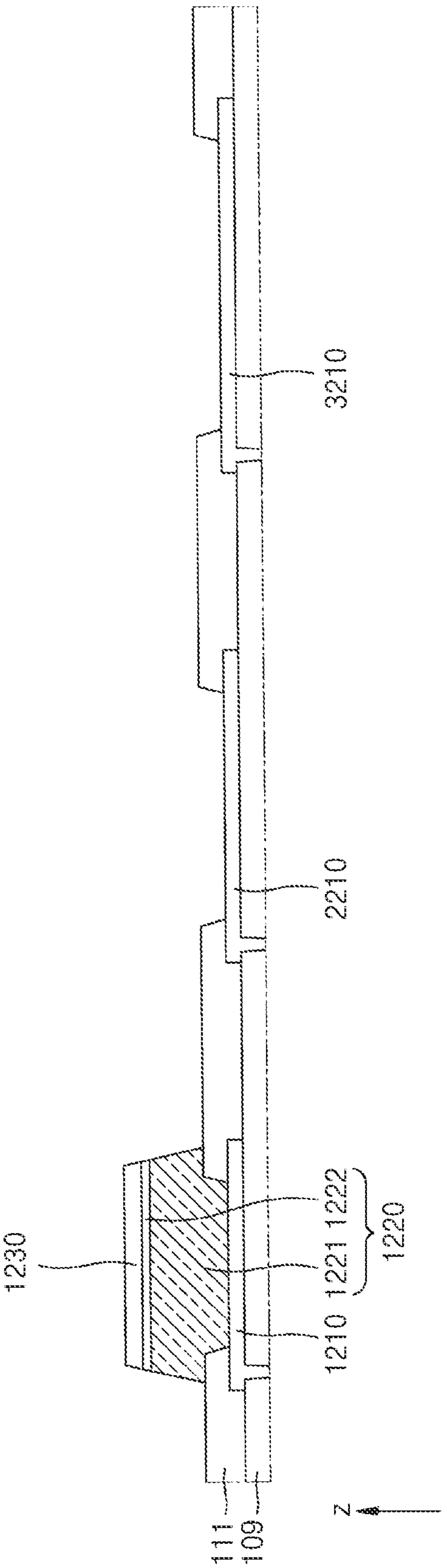
Figure 7D:
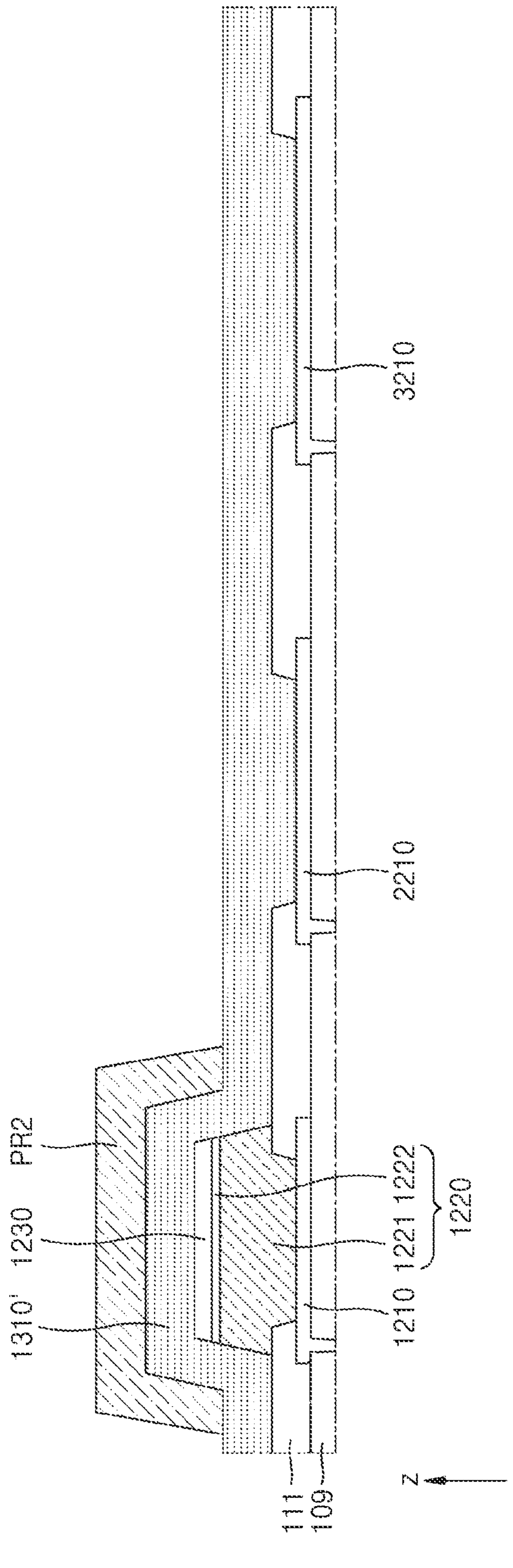
Figure 7E:
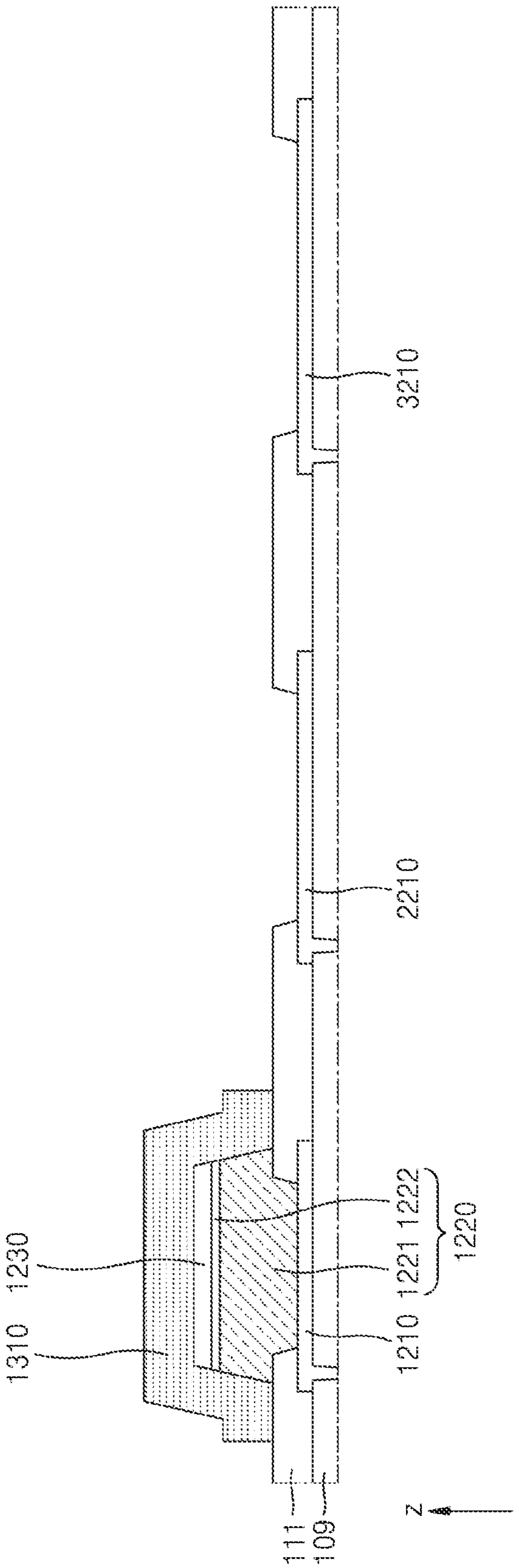
Figure 7F:
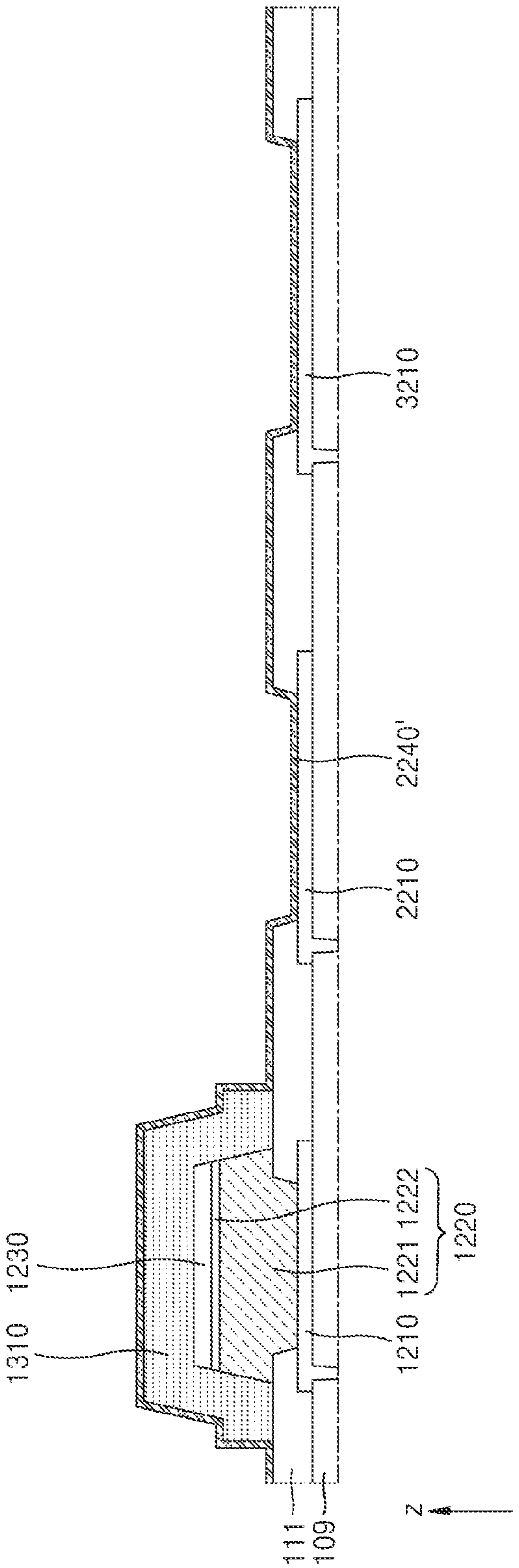
Figure 7G:
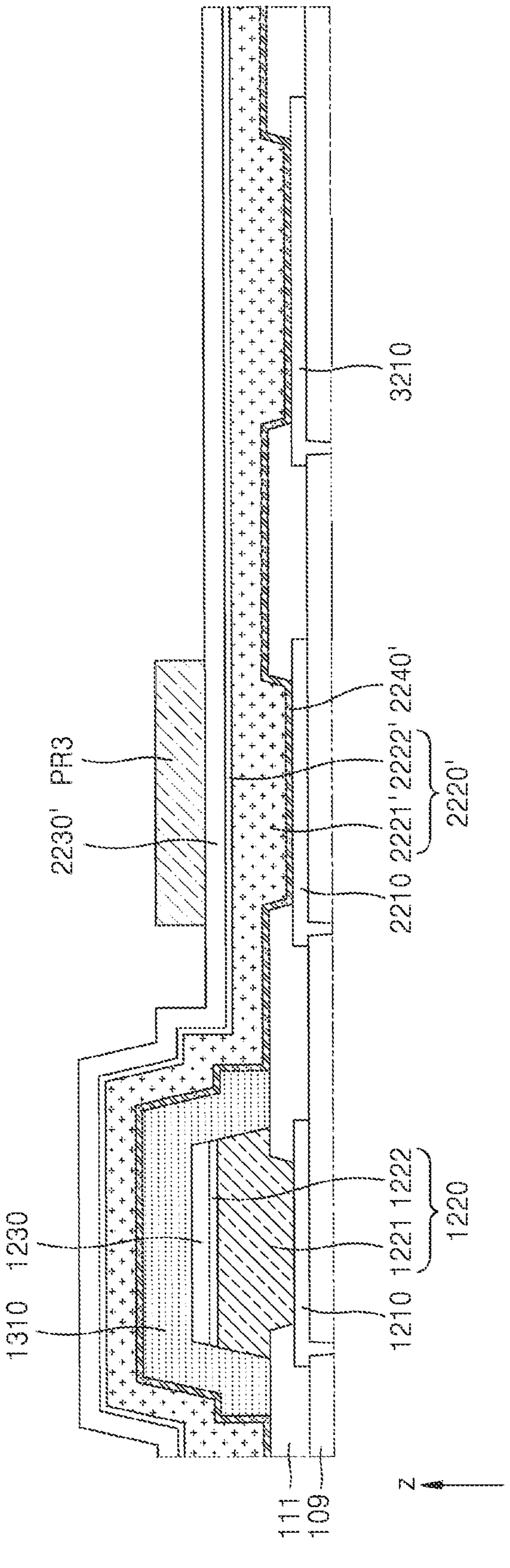
Figure 7H:
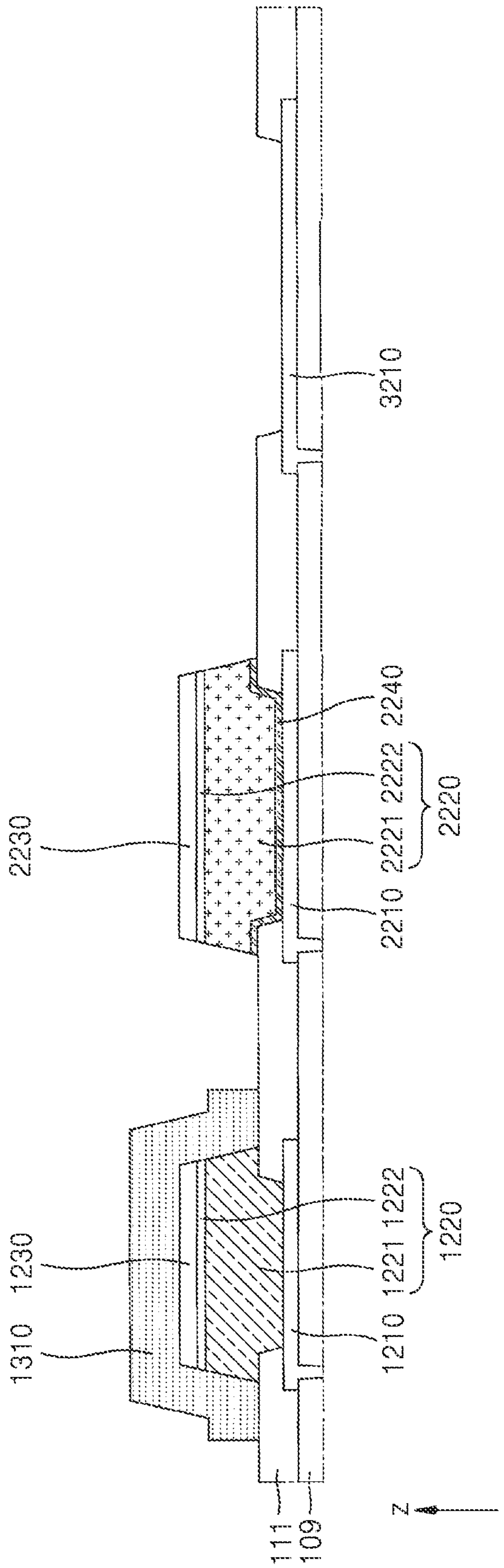
Figure 7I:
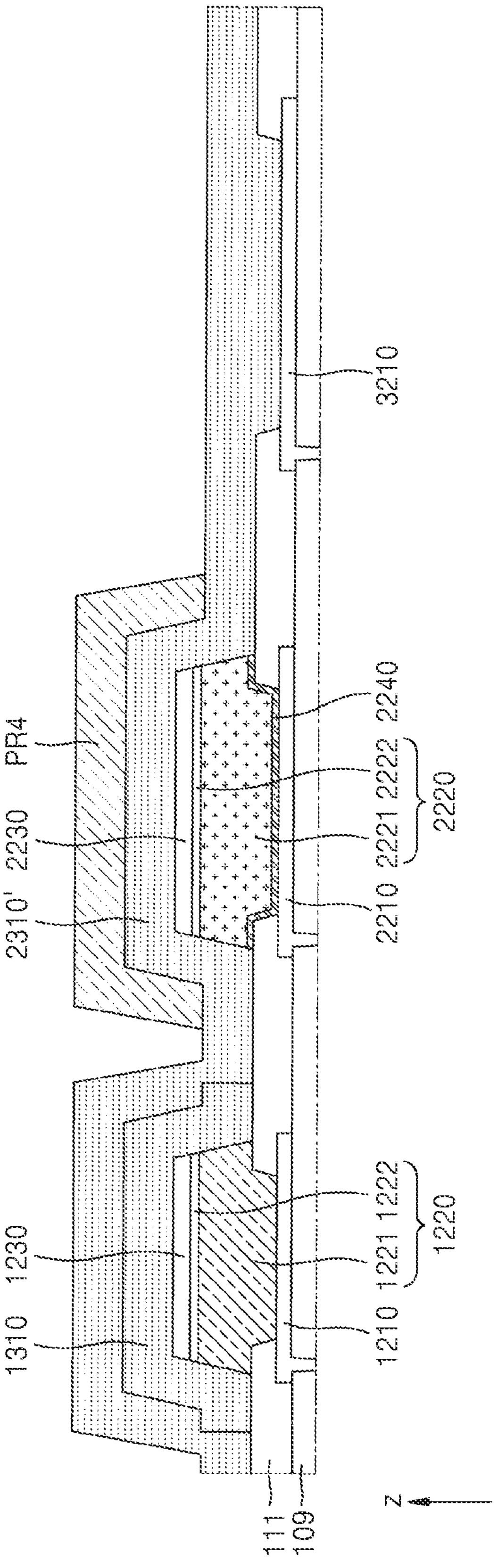
Figure 7J:
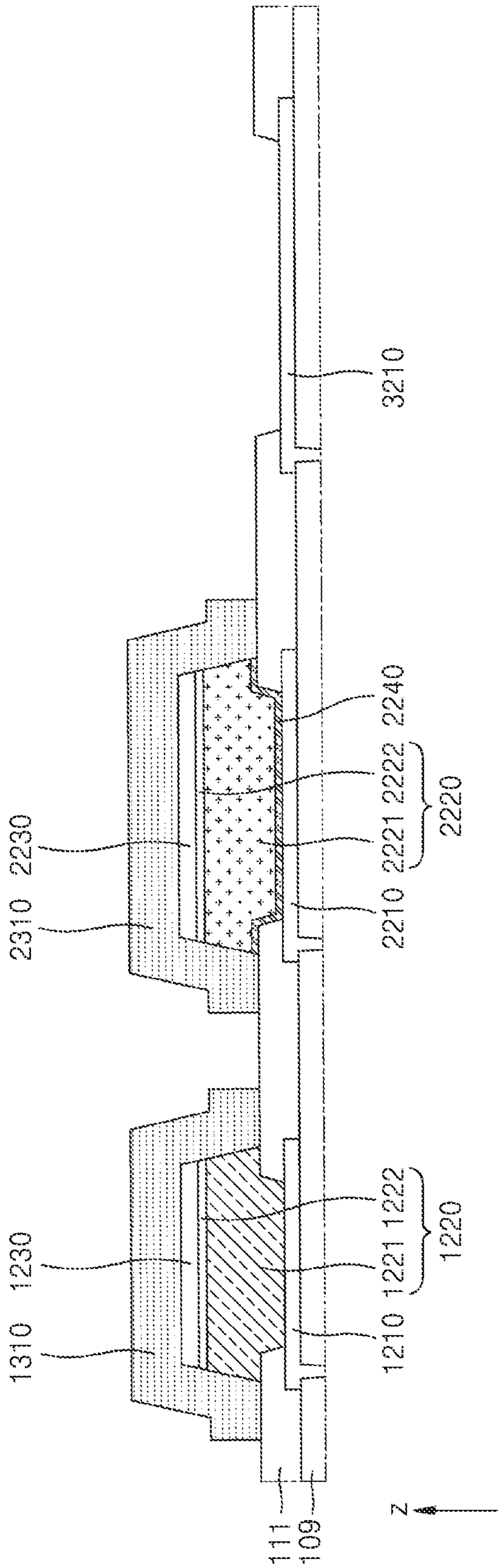
Figure 7K:
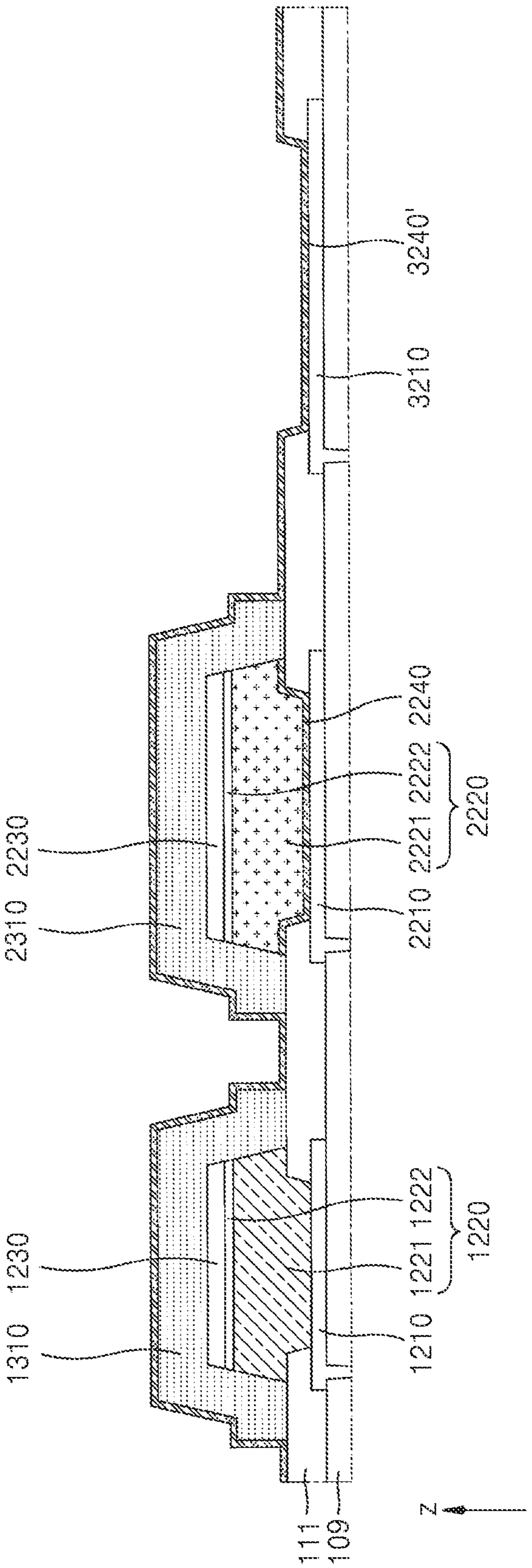
Figure 7L:
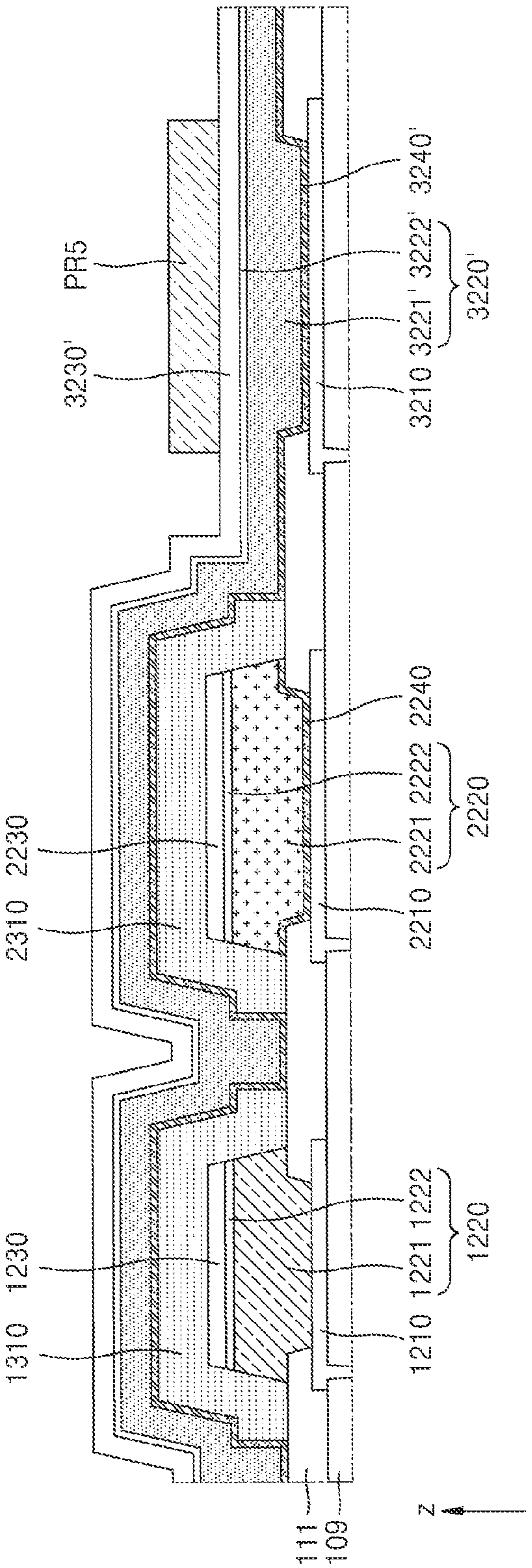
Figure 7M:
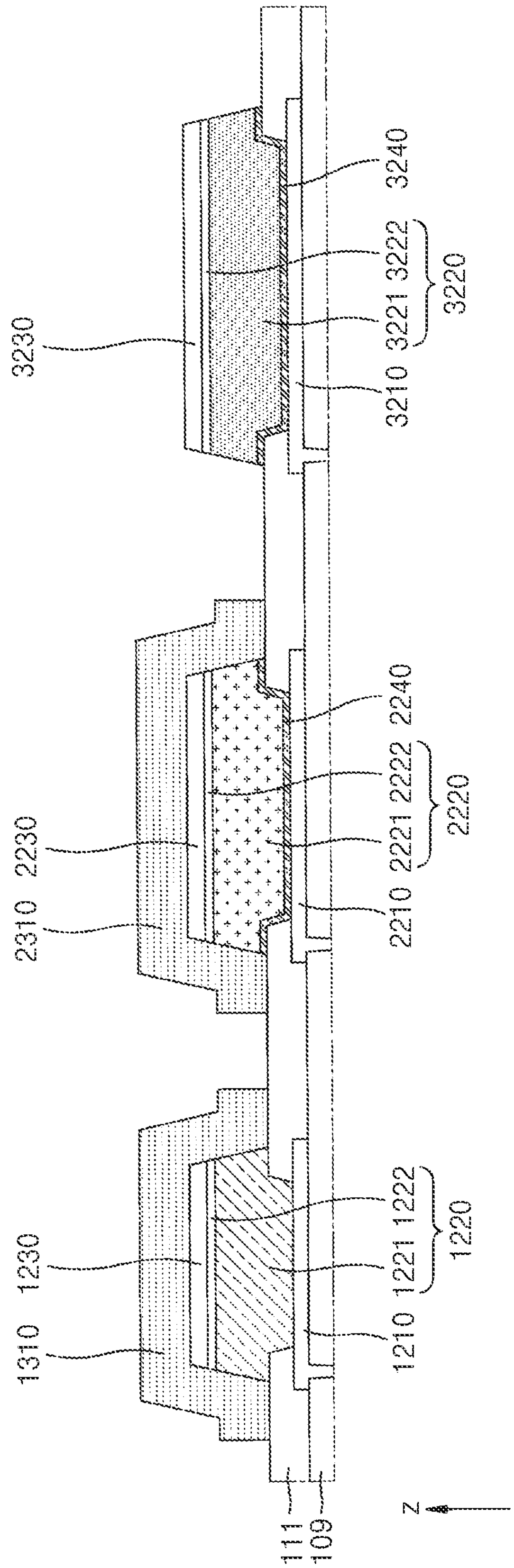
Figure 7N:
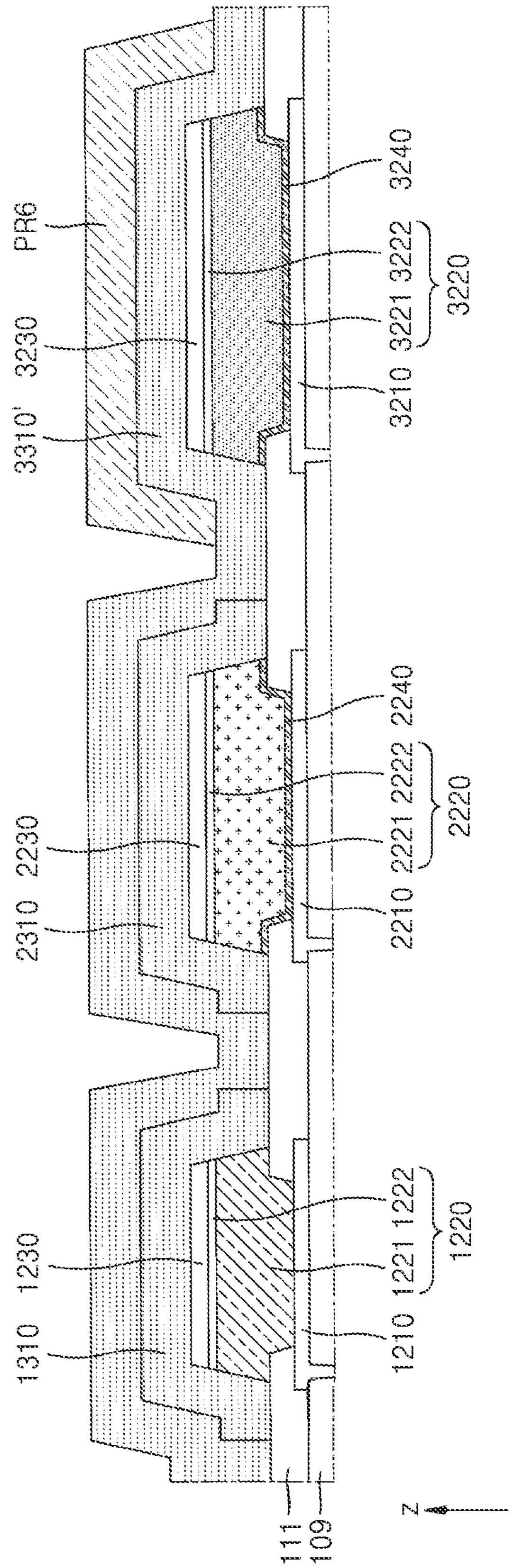
Figure 7O:
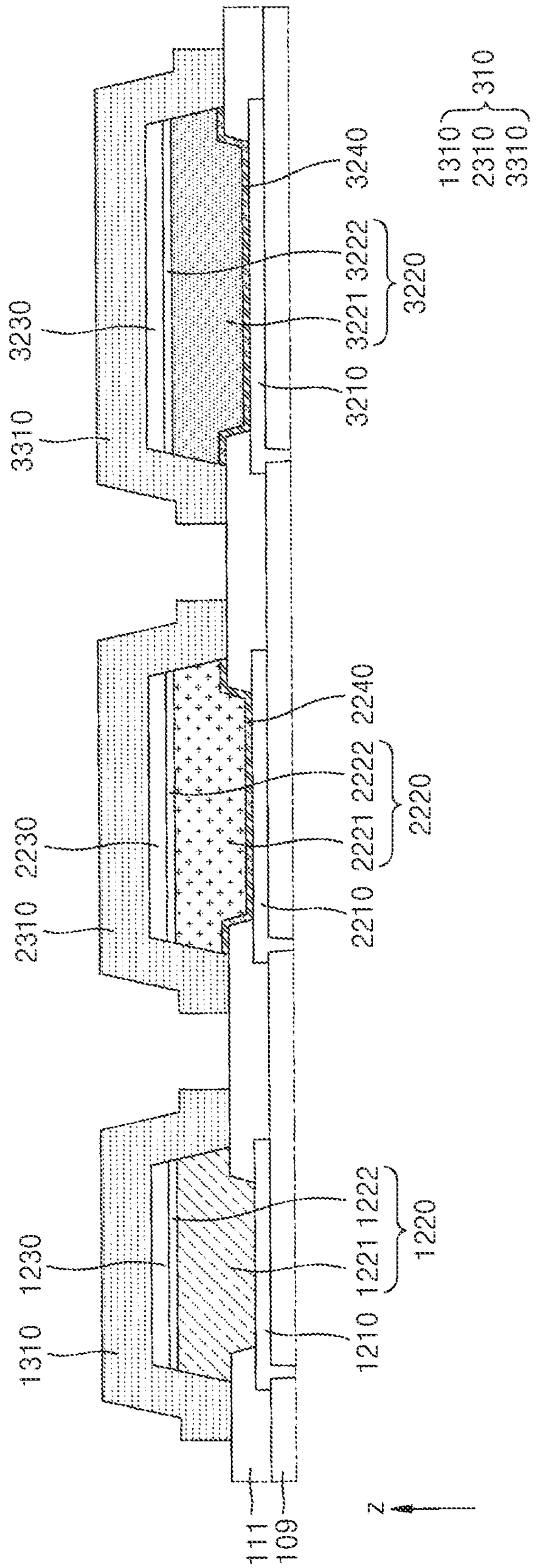
Figure 7P:
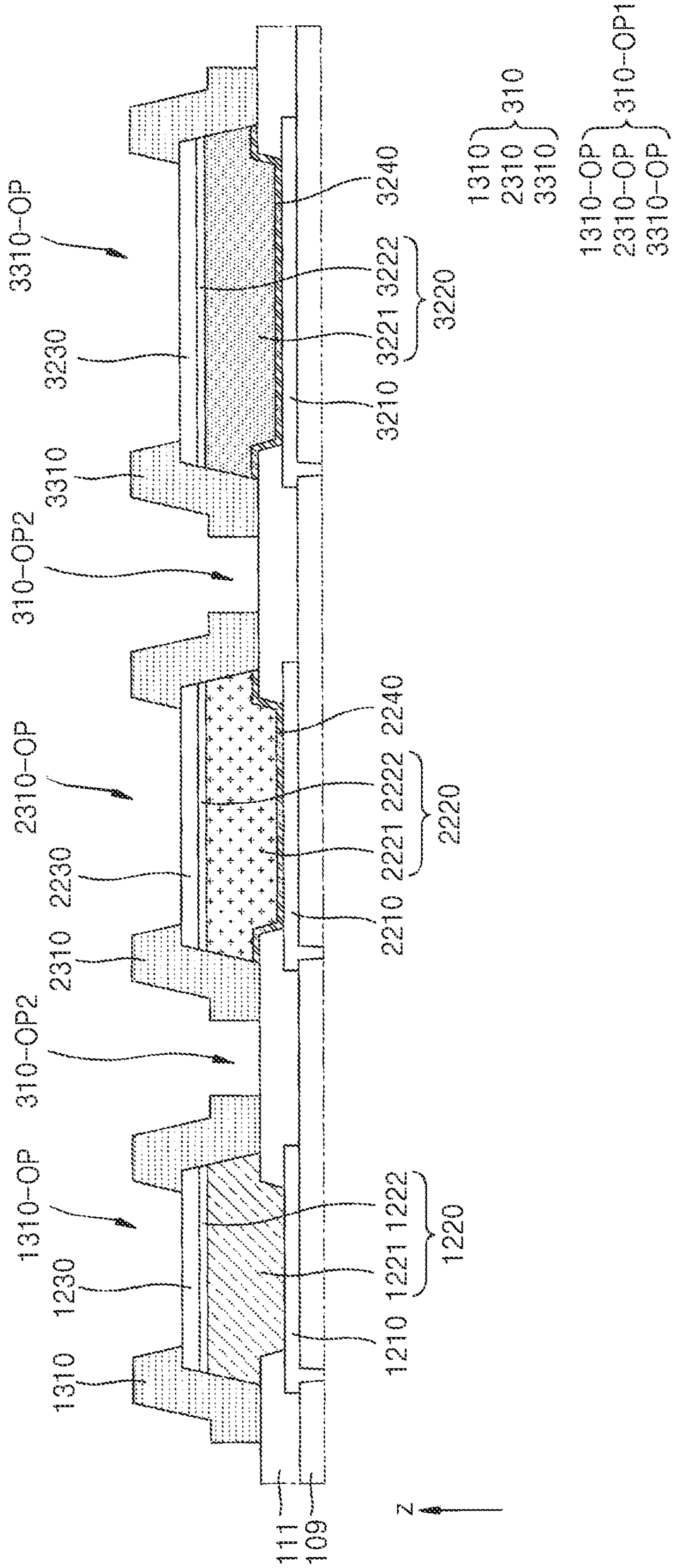

FIGS. 7A to 7P are schematic cross-sectional views showing states corresponding to a process of manufacturing a display apparatus according to some embodiments.

Referring to FIG. 7A, the first to third sub-pixel electrodes 1210, 2210, and 3210 may be arranged to be spaced apart from each other on the second organic insulating layer 109. The subpixel-defining layer 111 may include an opening overlapping the central portion of each of the first to third sub-pixel electrodes 1210, 2210, and 3210 and be located on the second organic insulating layer 109. Alternatively, the subpixel-defining layer 111 may cover the edge region (or the edge) of the first to third sub-pixel electrodes 1210, 2210, and 3210 and be located on the second organic insulating layer 109.

The first to third sub-pixel electrodes 1210, 2210, and 3210 may be arranged to be apart from each other. A portion of the subpixel-defining layer 111 may be located between separated spaces between the first to third sub-pixel electrodes 1210, 2210, and 3210.

A first stack layer 1220' may be arranged to cover the first to third sub-pixel electrodes 1210, 2210, and 3210 and the subpixel-defining layer 111. The first stack layer 1220' may include a first light-emitting material layer 1221' and a first opposite electrode layer 1222' on the first light-emitting material layer 1221', wherein the first light-emitting material layer 1221' is in direct contact with the first to third sub-pixel electrodes 1210, 2210, and 3210.

A 1-1 auxiliary material layer 1230' may be located on the first stack layer 1220'. As an example, the 1-1 auxiliary material layer 1230' may be located on the first opposite electrode layer 1222'. A first photoresist PR1 may be located on the 1-1 auxiliary material layer 1230' to overlap the first sub-pixel electrode 1210.

The first light-emitting material layer 1221' may include the same material as the first emission layer 1221 (see FIG. 4). The first opposite electrode layer 1222' may include the same material as the first opposite electrode 1222 (see FIG. 4). The 1-1 auxiliary material layer 1230' may include the same material as the 1-1 auxiliary layer 1230 (see FIG. 4).

Referring to FIG. 7B, the first stack 1220 and the 1-1 auxiliary layer 1230 may be formed. A portion of the first stack layer 1220' (see FIG. 7A) and the 1-1 auxiliary material layer 1230' (see FIG. 7A) may be etched using the first photoresist PR1 as a mask. The etching process may include dry-etching.

The first stack 1220 and the 1-1 auxiliary layer 1230 may be portions remaining after the etching process.

As an example, the first stack 1220 may be a portion remaining after a portion of the first stack layer 1220' (see FIG. 7A) is etched. The 1-1 auxiliary layer 1230 may be a portion remaining after the 1-1 auxiliary material layer 1230' (see FIG. 7A) is etched.

In other words, the first stack 1220 and the 1-1 auxiliary layer 1230 may be patterned using the first photoresist PR1 as a mask.

Referring to FIG. 7C, the first photoresist PR1 (see FIG. 7B) may be removed. The process of removing the first photoresist PR1 (see FIG. 7B) may include an ashing process (e.g., a dry-ashing process).

In the process shown in FIG. 7C, the lateral surface of the first stack 1220 and the upper surface and the lateral surfaces of the 1-1 auxiliary layer 1230 may be exposed. In this case, when the first stack 1220 and the 1-1 auxiliary layer 1230 are exposed to external air, there may be a risk of moisture transmission and/or oxidation. As an example, there may be a risk of oxidation of the lateral surfaces of the first opposite electrode 1222. Accordingly, to prevent the first stack 1220 and the 1-1 auxiliary layer 1230 from being exposed to external air, according to some embodiments, a vacuum state may be maintained from the present process to a process shown in FIG. 7D.

Referring to FIG. 7D, a 1-1 encapsulation material layer 1310' may be utilized in the embodiments shown in FIG. 7C. The 1-1 encapsulation material layer 1310' may cover the 1-1 auxiliary layer 1230, the subpixel-defining layer 111, the second sub-pixel electrode 2210, and the third sub-pixel electrode 3210.

A second photoresist PR2 may be located on the 1-1 encapsulation material layer 1310' to overlap the first sub-pixel electrode 1210.

Referring to FIG. 7E, the 1-1 encapsulation layer 1310 may be formed. A portion of the 1-1 encapsulation material layer 1310' (see FIG. 7D) may be etched using the second photoresist PR2 (see FIG. 7D) as a mask. The etching process may include dry-etching.

The 1-1 encapsulation layer 1310 may be a portion remaining after the etching process. As an example, the 1-1 encapsulation layer 1310 may be a portion remaining after a portion of the 1-1 encapsulation material layer 1310' (see FIG. 7D) is etched.

In other words, the 1-1 encapsulation layer 1310 may be patterned using the second photoresist PR2 (see FIG. 7D) as a mask.

After the 1-1 encapsulation layer 1310 is formed, the second photoresist PR2 (see FIG. 7D) may be removed.

Referring to FIG. 7F, a 2-2 auxiliary material layer 2240' may be utilized in the embodiments shown with respect to FIG. 7E.

The 2-2 auxiliary material layer 2240' may cover the 1-1 encapsulation layer 1310, the subpixel-defining layer 111, the second sub-pixel electrode 2210, and the third sub-pixel electrode 3210.

Referring to FIG. 7G, a second stack layer 2220' and a 1-2 auxiliary material layer 2230' may be utilized in the embodiments shown with respect to FIG. 7F.

As an example, the second stack layer 2220' may be located on a 2-2 auxiliary material layer 2240'. The second stack layer 2220' may include a second light-emitting material layer 2221' and a second opposite electrode layer 2222'. The second opposite electrode layer 2222' may be located on the second light-emitting material layer 2221'.

A 1-2 auxiliary material layer 2230' may be located on the second stack layer 2220'. As an example, the 1-2 auxiliary material layer 2230' may be located on the second opposite electrode layer 2222'. A third photoresist PR3 may be located on the 1-2 auxiliary material layer 2230' to overlap the second sub-pixel electrode 2210.

The second light-emitting material layer 2221' may include the same material as the second emission layer 2221 (see FIG. 4). The second opposite electrode layer 2222' may include the same material as the second opposite electrode 2222 (see FIG. 4). The 1-2 auxiliary material layer 2230' may include the same material as the 1-2 auxiliary layer 2230 (see FIG. 4).

Referring to FIG. 7H, the second stack 2220, the 1-2 auxiliary layer 2230, and the 2-2 auxiliary layer 2240 may be formed. Portions of the second stack layer 2220' (see FIG. 7G), the 1-2 auxiliary material layer 2230' (see FIG. 7G), and the 2-2 auxiliary material layer 2240' (see FIG. 7G) may be etched using the third photoresist PR3 (see FIG. 7G) as a mask. The etching process may include dry-etching.

The second stack 2220, the 1-2 auxiliary layer 2230, and the 2-2 auxiliary layer 2240 may be respectively portions remaining after the etching process.

As an example, the second stack 2220 may be a portion remaining after the second stack layer 2220' (see FIG. 7G) is etched. The 1-2 auxiliary layer 2230 may be a portion remaining after the 1-2 auxiliary material layer 2230' (see FIG. 7G) is etched. The 2-2 auxiliary layer 2240 may be a portion remaining after the 2-2 auxiliary material layer 2240' (see FIG. 7G) is etched.

In other words, the second stack 2220, the 1-2 auxiliary layer 2230, and the 2-2 auxiliary layer 2240 may be patterned using the third photoresist PR3 (see FIG. 7G) as a mask.

After the second stack 2220, the 1-2 auxiliary layer 2230, and the 2-2 auxiliary layer 2240 are formed, the third photoresist PR3 (see FIG. 7G) may be removed. The process of removing the third photoresist PR3 (see FIG. 7G) may include an ashing process (e.g., a dry-ashing process).

In the process shown in FIG. 7H, the lateral surface of the second stack 2220 and the upper surface and the lateral surfaces of the 1-2 auxiliary layer 2230 may be exposed. In this case, when the second stack 2220 and the 1-2 auxiliary layer 2230 are exposed to external air, there may be a risk of moisture transmission and/or oxidation. As an example, there may be a risk of oxidation of the lateral surfaces of the second opposite electrode 2222. Accordingly, to prevent the second stack 2220 and the 1-2 auxiliary layer 2230 from being exposed to external air, according to some embodiments, a vacuum state may be maintained from the present process to a process shown in FIG. 7I.

Referring to FIG. 7I, a 1-2 encapsulation material layer 2310' may be utilized in the embodiments shown with respect to FIG. 7H. The 1-2 encapsulation material layer 2310' may cover the 1-1 encapsulation layer 1310, the second stack 2220, the 1-2 auxiliary layer 2230, the 2-2 auxiliary layer 2240, the subpixel-defining layer 111, and the third sub-pixel defining layer 3210.

A fourth photoresist PR4 may be located on the 1-2 encapsulation material layer 2310' to overlap the second sub-pixel electrode 2210.

Referring to FIG. 7J, the 1-2 encapsulation layer 2310 may be formed. A portion of the 1-2 encapsulation material layer 2310' (see FIG. 7I) may be etched using the fourth photoresist PR4 (see FIG. 7I) as a mask. The etching process may include dry-etching.

The 1-2 encapsulation layer 2310 may be a portion remaining after the etching process. As an example, the 1-2 encapsulation layer 2310 may be a portion remaining after a portion of the 1-2 encapsulation material layer 2310' (see FIG. 7I) is etched.

In other words, the 1-2 encapsulation layer 2310 may be patterned using the fourth photoresist PR4 (see FIG. 7I) as a mask.

After the 1-2 encapsulation layer 2310 is formed, the fourth photoresist PR4 (see FIG. 7I) may be removed.

Referring to FIG. 7K, a 2-3 auxiliary material layer 3240' may be utilized in the embodiments shown with respect to FIG. 7J.

The 2-3 auxiliary material layer 3240' may cover the 1-1 encapsulation layer 1310, the 1-2 encapsulation layer 2310, the subpixel-defining layer 111, and the third sub-pixel electrode 3210.

Referring to FIG. 7I, a third stack layer 3220' and a 1-3 auxiliary material layer 3230' may be utilized in the embodiments shown with respect to FIG. 7K.

As an example, the third stack layer 3220' may be located on a 2-3 auxiliary material layer 3240'. The third stack layer 3220' may include a third light-emitting material layer 3221' and a third opposite electrode layer 3222'. The third opposite electrode layer 3222' may be located on the third light-emitting material layer 3221'.

A 1-3 auxiliary material layer 3230' may be located on the third stack layer 3220'. As an example, the 1-3 auxiliary material layer 3230' may be located on the third opposite electrode layer 3222'. A fifth photoresist PR5 may be located on the 1-3 auxiliary material layer 3230' to overlap the third sub-pixel electrode 3210.

The third light-emitting material layer 3221' may include the same material as the third emission layer 3221 (see FIG. 4). The third opposite electrode layer 3222' may include the same material as the third opposite electrode 3222 (see FIG. 4). The 1-3 auxiliary material layer 3230' may include the same material as the 1-3 auxiliary layer 3230 (see FIG. 4).

Referring to FIG. 7M, the third stack 3220, the 1-3 auxiliary layer 3230, and the 2-3 auxiliary layer 3240 may be formed. Portions of the third stack layer 3220' (see FIG. 7I), the 1-3 auxiliary material layer 3230' (see FIG. 7I), and the 2-3 auxiliary material layer 3240' (see FIG. 7I) may be etched using the fifth photoresist PR5 as a mask. The etching process may include dry-etching.

The third stack 2220, the 1-3 auxiliary layer 3230, and the 2-3 auxiliary layer 3240 may be respectively portions remaining after the etching process.

As an example, the third stack 3220 may be a portion remaining after the third stack layer 3220' (see FIG. 7I) is etched. The 1-3 auxiliary layer 3230 may be a portion remaining after the 1-3 auxiliary material layer 3230' (see FIG. 7I) is etched. The 2-3 auxiliary layer 3240 may be a portion remaining after the 2-3 auxiliary material layer 3240' (see FIG. 7I) is etched.

In other words, the third stack 3220, the 1-3 auxiliary layer 3230, and the 2-3 auxiliary layer 3240 may be patterned using the fifth photoresist PR5 (see FIG. 7I) as a mask.

After the third stack 3220, the 1-3 auxiliary layer 3230, and the 2-3 auxiliary layer 3240 are formed, the fifth photoresist PR5 (see FIG. 7I) may be removed. The process of removing the fifth photoresist PR5 (see FIG. 7I) may include an ashing process (e.g., a dry-ashing process).

In the process shown in FIG. 7M, the lateral surface of the third stack 3220 and the upper surface and the lateral surfaces of the 1-3 auxiliary layer 3230 may be exposed. In this case, when the third stack 3220 and the 1-3 auxiliary layer 3230 are exposed to external air, there may be a risk of moisture transmission and/or oxidation. As an example, there may be a risk of oxidation of the lateral surfaces of the third opposite electrode 3222. Accordingly, to prevent the third stack 3220 and the 1-3 auxiliary layer 3230 from being exposed to external air, according to some embodiments, a vacuum state may be maintained from the present process to a process shown in FIG. 7N.

Referring to FIG. 7N, a 1-3 encapsulation material layer 3310' may be utilized in the embodiments shown with respect to FIG. 7M. The 1-3 encapsulation material layer 3310' may cover the 1-1 encapsulation layer 1310, the 1-2 encapsulation layer 2310, the third stack 3220, the 1-3 auxiliary layer 3230, the 2-3 auxiliary layer 3240, and the subpixel-defining layer 111.

A sixth photoresist PR6 may be located on the 1-3 encapsulation material layer 3310' to overlap the third sub-pixel electrode 3210.

Referring to FIG. 7O, the 1-3 encapsulation layer 3310 may be formed. A portion of the 1-3 encapsulation material layer 3310' (see FIG. 7N) may be etched using the sixth photoresist PR6 (see FIG. 7N) as a mask. The etching process may include dry-etching.

The 1-3 encapsulation layer 3310 may be a portion remaining after the etching process. As an example, the 1-3 encapsulation layer 3310 may be a portion remaining after a portion of the 1-3 encapsulation material layer 3310' (see FIG. 7N) is etched.

In other words, the 1-3 encapsulation layer 3310 may be patterned using the sixth photoresist PR6 (see FIG. 7N) as a mask.

After the 1-3 encapsulation layer 3310 is formed, the sixth photoresist PR6 (see FIG. 7N) may be removed.

Referring to FIG. 7P, the 1-1 to 1-3 openings 1310-OP, 2310-OP, and 3310-OP may be formed.

The 1-1 opening 1310-OP may be formed by etching a portion of the 1-1 encapsulation layer 1310. As an example, the 1-1 opening 1310-OP may be formed by etching a portion of the upper surface of the 1-1 encapsulation layer 1310 in a region overlapping the 1-1 auxiliary layer 1230.

A portion of the upper surface of the 1-1 auxiliary layer 1230 may be exposed through the 1-1 opening 1310-OP. As an example, the central portion of the upper surface of the 1-1 auxiliary layer 1230 may be exposed through the 1-1 opening 1310-OP. In other words, the 1-1 opening 1310-OP may pass through the 1-1 encapsulation layer 1310.

The 1-2 opening 2310-OP may be formed by etching a portion of the 1-2 encapsulation layer 2310. As an example, the 1-2 opening 2310-OP may be formed by etching a portion of the upper surface of the 1-2 encapsulation layer 2310 in a region overlapping the 1-2 auxiliary layer 2230.

A portion of the upper surface of the 1-2 auxiliary layer 2230 may be exposed through the 1-2 opening 2310-OP. As an example, the central portion of the upper surface of the 1-2 auxiliary layer 2230 may be exposed through the 1-2 opening 2310-OP. In other words, the 1-2 opening 2310-OP may pass through the 1-2 encapsulation layer 2310.

The 1-3 opening 3310-OP may be formed by etching a portion of the 1-3 encapsulation layer 3310. As an example, the 1-3 opening 3310-OP may be formed by etching a portion of the upper surface of the 1-3 encapsulation layer 3310 in a region overlapping the 1-3 auxiliary layer 3230.

A portion of the upper surface of the 1-3 auxiliary layer 3230 may be exposed through the 1-3 opening 3310-OP. As an example, the central portion of the upper surface of the 1-3 auxiliary layer 3230 may be exposed through the 1-3 opening 3310-OP. In other words, the 1-3 opening 3310-OP may pass through the 1-3 encapsulation layer 3310.

The processes of forming the 1-1 to 1-3 openings 1310-OP, 2310-OP, and 3310-OP may be simultaneously performed or individually performed.

When the common electrode 250 (see FIG. 4) is utilized in the embodiments shown with respect to FIG. 7P, the embodiments shown with respect to FIG. 4 may be implemented. When the common electrode 250 (see FIG. 5) and the second encapsulation layer 320 (see FIG. 5) are utilized in the embodiments shown with respect to FIG. 7P, the embodiments shown with respect to FIG. 5 may be implemented.

According to some embodiments having the above configurations, in the display apparatus including the light-emitting diode, because the upper surface of the opposite electrode is covered by the first auxiliary layer, and the lateral surface of the opposite electrode is covered by the first encapsulation layer, the opposite electrode may not be exposed and oxidated during the deposition process. In addition, the opposite electrodes formed to be separated from each other may be electrically connected to each other through the common electrode. However, the scope of embodiments according to the present disclosure are not limited by these characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:

a first sub-pixel electrode and a second sub-pixel electrode spaced apart from each other;

a subpixel-defining layer covering edges of the first sub-pixel electrode and edges of the second sub-pixel electrode;

a first stack including a first emission layer and a first opposite electrode, on the subpixel-defining layer, and overlapping the first sub-pixel electrode;

a second stack including a second emission layer and a second opposite electrode, on the subpixel-defining layer, and overlapping the second sub-pixel electrode;

a first encapsulation layer covering each of edges of the first stack and edges of the second stack, and including first openings overlapping each of the first stack and the second stack, and a second opening between the first stack and the second stack;

a common electrode on the first encapsulation layer and electrically connected to the first opposite electrode of the first stack and the second opposite electrode of the second stack; and first auxiliary layers respectively between the first opposite electrode and the common electrode and between the second opposite electrode and the common electrode.

2. The display apparatus of claim 1, wherein the first encapsulation layer overlaps a lateral surface and a portion of an upper surface of the first stack and a lateral surface and a portion of an upper surface of the second stack.

3. The display apparatus of claim 1, further comprising a second auxiliary layer between the second sub-pixel electrode and the second emission layer, wherein a central portion of the second auxiliary layer directly contacts the second sub-pixel electrode, and an outer portion of the second auxiliary layer is spaced apart from the second sub-pixel electrode by the subpixel-defining layer.

4. The display apparatus of claim 1, wherein a number of layers between the first sub-pixel electrode and the first opposite electrode is different from a number of layers between the second sub-pixel electrode and the second opposite electrode.

5. The display apparatus of claim 1, further comprising a second encapsulation layer on the common electrode and extending to overlap the first stack and the second stack.

6. The display apparatus of claim 1, wherein, in a plan view, the second opening of the first encapsulation layer has a net structure surrounding each of the first openings.

7. A display apparatus comprising:

first to third sub-pixel electrodes spaced apart from each other;

a subpixel-defining layer covering edges of each of the first to third sub-pixel electrodes and including openings overlapping a central portion of each of the first to third sub-pixel electrodes;

first to third emission layers respectively on the first to third sub-pixel electrodes;

first to third opposite electrodes respectively on the first to third emission layers;

a 1-1 encapsulation layer covering the first emission layer and at least a portion of the first opposite electrode and including an opening overlapping a central portion of the first opposite electrode;

a 1-2 encapsulation layer covering the second emission layer and at least a portion of the second opposite electrode and including an opening overlapping a central portion of the second opposite electrode;

a 1-3 encapsulation layer covering the third emission layer and at least a portion of the third opposite electrode and including an opening overlapping the central portion of the first opposite electrode; and a common electrode on the first to third opposite electrodes and electrically connected to the first to third opposite electrodes, wherein the 1-1 to 1-3 encapsulation layers have an isolated shape and are spaced apart from each other.

8. The display apparatus of claim 7, wherein the common electrode is in contact with an upper surface of the subpixel-defining layer in a space between adjacent encapsulation layers among the 1-1 to 1-3 encapsulation layers.

9. The display apparatus of claim 7, further comprising:

a 1-1 auxiliary layer between the first opposite electrode and the common electrode;

a 1-2 auxiliary layer between the second opposite electrode and the common electrode; and a 1-3 auxiliary layer between the third opposite electrode and the common electrode.

10. The display apparatus of claim 9, wherein the 1-1 encapsulation layer directly contacts a lateral surface and a portion of an upper surface of the 1-1 auxiliary layer, a lateral surface of the first opposite electrode, and a lateral surface of the first emission layer.

11. The display apparatus of claim 7, further comprising a 2-2 auxiliary layer between the second sub-pixel electrode and the second emission layer, wherein the first sub-pixel electrode directly contacts the first emission layer.

12. The display apparatus of claim 7, further comprising a second encapsulation layer on the common electrode.

13. The display apparatus of claim 7, wherein, in a plan view, each of the 1-1 to 1-3 encapsulation layers surrounds edges of the 1-1 to 1-3 opposite electrodes.

14. A method of manufacturing a display apparatus, the method comprising:

forming a first sub-pixel electrode and a second sub-pixel electrode spaced apart from each other;

forming a first stack layer on the first sub-pixel electrode and the second sub-pixel electrode, wherein the first stack layer includes a light-emitting material layer and an opposite electrode layer;

forming a 1-1 auxiliary material layer on the first stack layer;

forming a first stack and a 1-1 auxiliary layer overlapping the first stack by etching the first stack layer and a portion of the 1-1 auxiliary material layer, wherein the first stack overlaps the first sub-pixel electrode and includes a first emission layer and a first opposite electrode;

forming a 1-1 encapsulation material layer to cover the first stack and the 1-1 auxiliary layer;

forming a 1-1 encapsulation layer by etching a portion of the 1-1 encapsulation material layer, wherein the 1-1 encapsulation layer overlaps an upper surface of the first stack and an upper surface of the 1-1 auxiliary layer entirely;

forming a second stack layer on the 1-1 encapsulation layer and the second sub-pixel electrode, wherein the second stack layer includes a light-emitting material layer and an opposite electrode layer;

forming a 1-2 auxiliary material layer on the second stack layer;

forming a second stack and a 1-2 auxiliary layer overlapping the second stack by etching the second stack layer and a portion of the 1-2 auxiliary material layer, wherein the second stack overlaps the second sub-pixel electrode and includes a second emission layer and a second opposite electrode;

forming a 1-2 encapsulation material layer to cover the second stack and the 1-2 auxiliary layer; and forming a 1-2 encapsulation layer by etching a portion of the 1-2 encapsulation material layer, wherein the 1-2 encapsulation layer overlaps an upper surface of the second stack and an upper surface of the 1-2 auxiliary layer entirely, wherein the 1-1 encapsulation layer and the 1-2 encapsulation layer are spaced apart from each other.

15. The method of claim 14, further comprising forming a first opening in each of the 1-1 encapsulation layer and the 1-2 encapsulation layer.

16. The method of claim 15, further comprising forming a common electrode layer overlapping the first opening of the 1-1 encapsulation layer and the first opening of the 1-2 encapsulation layer.

17. The method of claim 16, further comprising forming a subpixel-defining layer covering edges of the first sub-pixel electrode and edges of the second sub-pixel electrode, wherein the common electrode layer directly contacts an upper surface of the subpixel-defining layer through a separation region between the 1-1 encapsulation layer and the 1-2 encapsulation layer.

18. The method of claim 14, wherein the 1-1 encapsulation layer directly contacts a lateral surface and a portion of an upper surface of the 1-1 auxiliary layer, and a lateral surface of the first stack, and the 1-2 encapsulation layer is in direct contact with a lateral surface and a portion of an upper surface of the 1-2 auxiliary layer, and a lateral surface of the second stack.

19. The method of claim 14, further comprising forming a second auxiliary material layer under the second stack layer, wherein the forming of the second stack includes forming a second auxiliary layer by etching a portion of the second auxiliary material layer, the second auxiliary layer directly contacting an upper surface of the second sub-pixel electrode.

* * * * *